United States Patent
Nakaya et al.

(10) Patent No.: US 7,251,184 B2
(45) Date of Patent: Jul. 31, 2007

(54) SEMICONDUCTOR MEMORY DEVICE

(75) Inventors: Shuji Nakaya, Kobe (JP); Wataru Abe, Hirakata (JP); Mitsuaki Hayashi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/400,404

(22) Filed: Apr. 10, 2006

(65) Prior Publication Data

US 2006/0239109 A1   Oct. 26, 2006

(30) Foreign Application Priority Data

Apr. 13, 2005   (JP) .............. 2005-115630

(51) Int. Cl.
*G11C 8/00*   (2006.01)
(52) U.S. Cl. .............. 365/230.03; 365/230.06; 365/189.08
(58) Field of Classification Search ........... 365/230.01, 365/230.03, 230.06, 189.08
See application file for complete search history.

(56) References Cited

U.S. PATENT DOCUMENTS

| | | | | |
|---|---|---|---|---|
| 5,675,529 A * | 10/1997 | Poole | .......... | 365/63 |
| 5,917,745 A * | 6/1999 | Fujii | .......... | 365/63 |
| 6,028,813 A * | 2/2000 | Choi | .......... | 365/230.04 |
| 6,038,170 A * | 3/2000 | Shiba | .......... | 365/185.13 |
| 6,069,831 A * | 5/2000 | Jang et al. | .......... | 365/210 |
| 6,088,277 A | 7/2000 | Kim et al. | | |
| 6,226,214 B1 * | 5/2001 | Choi | .......... | 365/230.03 |
| 6,310,809 B1 * | 10/2001 | Roohparvar et al. | .......... | 365/203 |
| 6,707,700 B2 * | 3/2004 | Kang | .......... | 365/145 |
| 6,822,907 B2 * | 11/2004 | Maruyama et al. | .... | 365/185.21 |
| 6,944,056 B2 * | 9/2005 | Matsuzaki et al. | ..... | 365/185.05 |
| 7,113,433 B2 * | 9/2006 | Chan et al. | .......... | 365/190 |
| 7,158,428 B2 * | 1/2007 | Fujimoto | .......... | 365/203 |
| 7,180,793 B2 * | 2/2007 | Matsuzaki et al. | ..... | 365/189.08 |

FOREIGN PATENT DOCUMENTS

JP   06-176592   6/1994

* cited by examiner

*Primary Examiner*—Viet Q. Nguyen
(74) *Attorney, Agent, or Firm*—McDermott Will & Emery LLP

(57) ABSTRACT

A semiconductor memory device is provided which has a hierarchical bit line structure and can perform a high-speed read operation even with a low voltage. A subarray 12 includes a first MOS transistor PD1 for charging a main bit line MBL1 and a second MOS transistor PS1 for charging a sub-bit line SBL1_1. The source electrode of the second MOS transistor PS1 is connected to a power source voltage, and the source electrode of the first MOS transistor PD1 is connected via a fourth MOS transistor PD2 to the power source voltage. Since there is not a resistance between the main bit line MBL1 and the sub-bit line SBL1_1, which is present if a transistor is used to achieve conduction therebetween, discharging of the main bit line and charging of the sub-bit line can be performed with high speed.

13 Claims, 15 Drawing Sheets

SEMICONDUCTOR MEMORY DEVICE

BACKGROUND OF THE INVENTION

1. Field of the Invention

The present invention relates to a semiconductor memory device, and more particularly, to a semiconductor memory device having a hierarchical bit line structure.

2. Description of the Background Art

In conventional semiconductor memory devices, bit lines are hierarchically arranged in order to prevent the level of the bit line from being reduced due to a cut-off leakage current. For example, Japanese Patent Laid-Open Publication No. 6-176592 (p. 2, FIG. 2) discloses a mask ROM having a contact, as an example of such a semiconductor memory device having a hierarchical bit line structure.

FIG. 13 is a block diagram illustrating a configuration of a conventional mask ROM. The mask ROM 50 comprises a memory cell array 51, an address buffer 52, a row decoder 53, a column decoder 54, and a read circuit 55.

The memory cell array 51 comprises (m×n) subarrays 57 (MS1_1 to MSm_n) arranged in a matrix, m block select lines SL4_1 to SL4_m, (y×m) word lines WL1_1 to WLy_m, and n main bit lines MBL1 to MBLn. The subarrays 57 (MSi_1 to MSi_n) provided on an i-th row are each connected to the block select line SL4_i and the word lines WL1_i to WLy_i. The subarrays 57 (MS1_j to MSm_j) provided on a j-th column are each connected to the main bit line MBLj.

The address buffer 52 outputs an externally input address to the row decoder 53 and the column decoder 54.

Based on the address signal output from the address buffer 52, the row decoder 53 selects one block select line (e.g., SL4_i) from the block select lines SL4_1 to SL4_m, and one word line (e.g., WLk_i) from the word lines WL1_i to WLy_i.

Based on the address signal output from the address buffer 52, the column decoder 54 selects one main bit line (e.g., MBLj) from the main bit lines MBL1 to MBLn and causes the selected main bit line (MBLj) to be in conduction with the read circuit 55.

The read circuit 55 is connected to the column decoder 54. The read circuit 55 has a function of amplifying an amplitude of a signal on the main bit line MBLj selected by the column decoder 54 and outputting data corresponding to a level of the main bit line MBLj to the outside, a function of precharging or discharging the selected main bit line MBLj, and a function of supplying charge to the main bit line MBLj to compensate for charge lost due to leakage. The read circuit 55 outputs H-level data when a voltage of the main bit line MBLj is at the H level, and L-level data when the voltage of the main bit line MBLj is at the L level.

Note that the above-described plurality of subarrays MS1_1 to MSm_n are all similarly configured, and therefore, only the subarray MS1_1 will be hereinafter described.

FIG. 14 is a circuit diagram illustrating a configuration of the subarray 57 of FIG. 13. The subarray 57 comprises y memory cells MC1 to MCy each composed of an N-channel MOS transistor and a block select transistor NT1 composed of an N-channel MOS transistor.

The gate electrodes of the memory cells MC1 to MCy are connected to the word lines WL1_1 to WLy_1, respectively, and the source electrodes thereof are connected to a ground voltage. The drain electrodes of the memory cells MC1 to MCy are each connected via a contact (not shown) to a sub-bit line SBL1_1 when data to be stored is "0", and are not connected to the sub-bit line SBL1_1 when data to be stored is "1". For example, as illustrated in FIG. 14, the memory cells MC1 and MC2 stores data "0" and the memory cell MCy stores data "1".

On the other hand, the gate electrode of the block select transistor NT1 is connected to the block select line SL4_1, the source electrode thereof is connected to the sub-bit line SBL1_1, and the drain electrode thereof is connected to the main bit line MBL1.

FIG. 15 is a timing diagram of the conventional semiconductor memory device. In FIG. 15, an address AD1 is, for example, an address which specifies the memory cell MC1 in the subarray MS1_1 of FIG. 13, and an address AD2 is, for example, an address which specifies the memory cell MC1 in another subarray (MS1_i) which is located on a column different from that of the subarray MS1_1. A time period for which a clock of FIG. 15 is at the L level is a time period for which a precharge operation is performed. A time period for which the clock is at the H level is a time period for which a read operation is performed. Hereinafter, referring to FIG. 15 in combination with FIG. 14, a data read operation in the conventional semiconductor memory device will be described.

(1) Time period before time T1

Since the subarray MS1_1 is in the non-selected state before time T1, the voltages of the block select line SL4_1, the word lines WL1_1 to WL1_y, and the main bit line MBL1 connected to the subarray MS1_1 are all held at the L level. As illustrated in FIG. 14, since the sub-bit line SBL1_1 is not connected to any power source lines, the voltage of the sub-bit line SBL1_1 is in the floating state (high impedance state). Note that, since the sub-bit line SBL1_1 is not connected to the gate electrodes of any MOS transistors, there are no problems, such as an unstable transistor operation and the like.

(2) Time period from time T1 to time T2

Initially, when the address AD1 is inputted at time T1, the row decoder 53 selects the block select line SL4_1 and causes the block select line SL4_1 to go to the H level. Thereby, the block select transistor NT1 in the subarray MS1_1 goes to the ON state, so that the main bit line MBL1 is caused to be in conduction with the sub-bit line SBL1_1.

Next, the main bit line MBL1 and the sub-bit line SBL1_1 are charged by the precharge function of the read circuit 55, to go to the H level. Note that, for this time period, the other block select lines (SL4_2 to SL4_m of FIG. 13) are all held at the L level.

(3) Time period from time T2 to time T3

When the clock goes to the H level, the row decoder 53 selects the word line WL1_1 based on the address AD1, and causes the voltage of the word line WL1_1 to go to the H level. In this case, the memory cell MC1 goes to the ON state. Since the drain electrode of the memory cell MC1 is connected to the sub-bit line SBL1_1, when the memory cell MC1 goes to the ON state, charge accumulated on the sub-bit line SBL1_1 and the main bit line MBL1 are discharged through the source electrode of the memory cell MC1. Therefore, the voltages of the main bit line MBL1 and the sub-bit line SBL1_1 go to the L level as illustrated with solid lines in FIG. 15. As a result, the read circuit 55 outputs L-level data to the outside, corresponding to the voltage of the main bit line MBL1.

On the other hand, it is assumed that the drain electrode of the memory cell MC1 is not connected to the sub-bit line SBL1_1. In this case, charge accumulated on the sub-bit line SBL1_1 and the main bit line MBL1 is not discharged through the memory cell MC1 even when the memory cell MC1 goes to the ON state, and therefore, the sub-bit line SBL1_1 and the main bit line MBL1 are held at the H level as illustrated with dashed lines in FIG. 15. As a result, the read circuit 55 outputs H-level data to the outside, corresponding to the voltage of the main bit line MBL1.

(4) Time period from time T4 to time T7

Thereafter, also with respect to the address AD2 input at time T4, stored data is read out in a manner similar to that for the above-described time period from time T1 to time T4. Note that, in the example of FIG. 15, since the address AD2 is an address which specifies the memory cell MC1 in a subarray MS1_i on a column different from that of the subarray MS1_1, the block select line SL4_1 is held at the H level for this time period. The voltage of the word line WL1_1 is changed to the H level for a data read time period from time T5 to time T6 since the word line WL1_1 is selected by the row decoder 53.

As described above, the conventional mask ROM is configured so that a plurality of memory cells provided along a single main bit line are not connected directly to the main bit line, but are divided into subarrays and are connected via respective sub-bit lines. Therefore, after the sub-bit line is precharged, accumulated charge is discharged due to an off-leakage current from memory cells (e.g., MC1 and MC2) connected to the sub-bit line, so that the level of the main bit line can be significantly suppressed from being reduced. Therefore, even in a miniaturization process having an increase in the off leakage current, a large scale memory array can be achieved.

In the above-described semiconductor memory device, a main bit line is connected to a sub-bit line via a block select transistor. Therefore, when the main bit line is discharged, charge accumulated on the main bit line is discharged via the block select transistor from the source electrode of a memory cell. Note that, in order to reduce the area of the semiconductor memory device, a small-size transistor is used in a memory cell. The sub-bit line is charged via the main bit line and the block select transistor by a precharge transistor in a read circuit.

In the case where such a conventional semiconductor memory device is used with a low voltage, when a main bit line is discharged, the substrate bias effect is significant in a block select transistor, so that the current drive capability of the block select transistor to discharge the main bit line is reduced. When a sub-bit line is charged, the influence of the substrate bias effect in the block select transistor reduces the current drive capability of the block select transistor to charge the sub-bit line, so that high-speed precharge cannot be performed. Therefore, it is not possible to read out stored data with high speed.

Therefore, a method of reducing a threshold voltage of a portion of transistors during manufacture, and a method for reducing the influence of the substrate bias effect and on-resistance by increasing a gate voltage of a portion of transistors, have been proposed.

However, in the former method of reducing the threshold voltage, a dedicated production step is required in addition to ordinary production steps. On the other hand, in the latter method of increasing the gate voltage, the area of a semiconductor memory device is increased by adding a booster circuit. Therefore, even when either of the methods is employed, the manufacturing cost of a semiconductor memory device increases.

SUMMARY OF THE INVENTION

Therefore, an object of the present invention is to provide a semiconductor memory device having a hierarchical bit line structure, which does not require a transistor in which a drain electrode and a source electrode are connected to a main bit line and a sub-bit line, respectively, and can perform a read operation with a low voltage, thereby being advantageous in terms of cost.

The present invention is directed to a semiconductor memory device with a hierarchical bit line structure. The semiconductor memory device comprises a plurality of subarrays arranged in a row direction and a column direction, a plurality of word lines connected to the subarrays provided in the row direction, a plurality of main bit lines connected to the subarrays provided in the column direction, and a voltage control section for controlling a voltage supplied to the subarray. The subarray includes a sub-bit line, a plurality of memory cells which are connected to the word lines and change a voltage of the sub-bit line to a voltage corresponding to data stored therein, in response to selection of the word lines, a first MOS transistor having a gate electrode connected to the sub-bit line and a drain electrode connected to the main bit line, a second MOS transistor having a gate electrode connected to the main bit line and a drain electrode connected to the sub-bit line, a third MOS transistor, whose conductivity type is different from a conductivity type of the second MOS transisitor, having a gate electrode connected to the main bit line, a source electrode connected to a ground voltage, and a drain electrode connected to the sub-bit line. The voltage control section is capable of applying a power source voltage to the source electrode of the first MOS transistor and the source electrode of the second MOS transistor.

The voltage control section may include a block select line, and a fourth MOS transistor having a gate electrode connected to the block select line, a source electrode connected to the power source voltage, and a drain electrode connected to the source electrode of the first MOS transistor. The power source voltage may be applied to the source electrode of the second MOS transistor.

In this case, preferably, a current drive capability of the second MOS transistor is larger than a total amount of off leakage currents of MOS transistors included in the memory cells connected to the sub-bit line and is smaller than a current drive capability of each of the MOS transistors included in the memory cells.

The voltage control section may include a first block select line, a second block select line, a fourth MOS transistor having a gate electrode connected to the first block select line, a source electrode connected to the power source voltage, and a drain electrode connected to the source electrode of the first MOS transistor, a fifth MOS transistor having a gate electrode connected to the second block select line, a source electrode connected to the power source voltage, and a drain electrode connected to the source electrode of the second MOS transistor, and a sixth, whose conductivity type is different from a conductivity type of the fifth MOS transisitor, MOS transistor having a gate electrode connected to the second block select line, a source electrode connected to the ground voltage, and a drain electrode connected to the sub-bit line.

In this case, preferably, a current drive capability of each of the second MOS transistor and the fifth MOS transistor, which are connected in series with each other, is larger than a total amount of off leakage currents of MOS transistors included in the memory cells connected to the sub-bit line and is smaller than a current drive capability of each of the MOS transistors included in the memory cells.

The voltage control section may include a first block select line, a second block select line, a fourth MOS transistor having a gate electrode connected to the first block select line, a source electrode connected to the power source voltage, and a drain electrode connected to the source electrode of the first MOS transistor, a fifth MOS transistor having a gate electrode connected to the second block select line, a source electrode connected to the power source voltage, and a drain electrode connected to the source electrode of the second MOS transistor, a sixth MOS transistor, whose conductivity type is different from a conductivity type of the fifth MOS transisitor, having a gate electrode connected to the second block select line, a source electrode connected to the ground voltage, and a drain electrode connected to the sub-bit line, and a seventh MOS transistor having a gate electrode connected to the third block select line, a source electrode connected to the power source voltage, and a drain electrode connected to the source electrode of the second MOS transistor.

In this case, preferably, a current drive capability of each of the second MOS transistor and the fifth MOS transistor, which are connected in series with each other, is larger than a total amount of off leakage currents of MOS transistors included in the memory cells connected to the sub-bit line and is smaller than a current drive capability of each of the MOS transistors included in the memory cells.

The voltage control section may include a block select line, a fourth MOS transistor having a gate electrode connected to the block select line, a source electrode connected to the power source voltage, and a drain electrode connected to the source electrode of the first MOS transistor and the source electrode of the second MOS transistor, and a fifth MOS transistor, whose conductivity type is different from a conductivity type of the fourth MOS transisitor, having a gate electrode connected to the block select line, a source electrode connected to the ground voltage, and a drain electrode connected to the sub-bit line.

In this case, preferably, a current drive capability of each of the second MOS transistor and the fourth MOS transistor, which are connected in series with each other, is larger than a total amount of off leakage currents of MOS transistors included in the memory cells connected to the sub-bit line and is smaller than a current drive capability of each of the MOS transistors included in the memory cells.

The memory cell may include a MOS transistor having a gate electrode connected to the word line, a source electrode connected to the ground voltage, and a drain electrode which is, or is not, connected to the sub-bit line, depending on data stored therein. Alternatively, the memory cell may include a MOS transistor having a gate electrode connected to the word line, a source electrode connected to the ground voltage, and a drain electrode connected to the sub-bit line, and having a threshold voltage having a magnitude corresponding to data stored therein.

The voltage control section may be provided for each of the plurality of subarrays. Alternatively, the plurality of subarrays may be divided into groups, and the voltage control section may be provided for each group.

According to the semiconductor memory device of the present invention, by applying a power source voltage to a main bit line and a sub-bit line, discharging of the main bit line and charging of the sub-bit line can be performed with high speed. Therefore, a semiconductor memory device can be configured to perform a high-speed read operation with a low power source voltage.

In addition, the semiconductor memory device of the present invention does not include a transistor for causing the main bit line and the sub-bit line to be in conduction with each other. Therefore, a specialized production step or circuit for reducing the substrate bias effect and on-resistance of the transistor is not required, thereby making it possible to reduce the area of the semiconductor memory device and suppress an increase in manufacturing cost.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
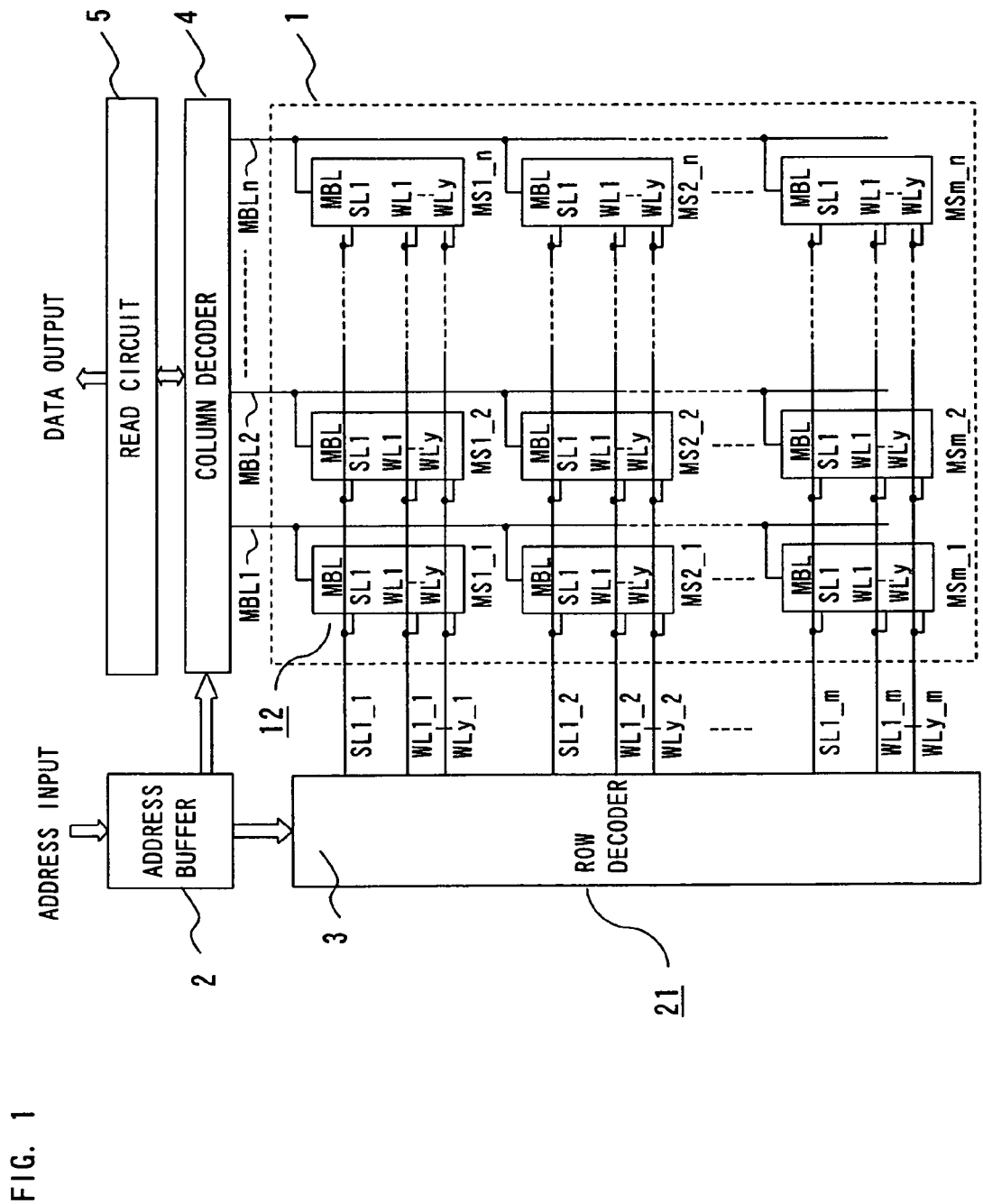
FIG. 1 is a block diagram illustrating a configuration of a semiconductor memory device according to a first embodiment of the present invention.

FIG. 1 is a block diagram illustrating a configuration of a semiconductor memory device according to a first embodiment of the present invention. The semiconductor memory device 21 comprises a memory cell array 1, an address buffer 2, a row decoder 3, a column decoder 4, and a read circuit 5.

The memory cell array 1 includes (m×n) subarrays 12 (MS1_1 to MSm_n) arranged in a matrix, m block select lines SL1_1 to SL1_m, (y×m) word lines WL1_1 to WLy_m, and n main bit lines MBL1 to MBLn. The subarrays 12 (MSi_1 to MSi_n) provided on an i-th row are each connected to the block select line SL1_i and the word lines WL1_i to WLy_i. The subarrays 12 (MS1_j to MSm_j) provided on a j-th column are each connected to the main bit line MBLj.

The address buffer 2 outputs an externally input address to the row decoder 3 and the column decoder 4.

Based on the address signal output from the address buffer 2, the row decoder 3 selects one block select line (e.g., SL1_i) from the block select lines SL1_1 to SL1_m, and one word line (e.g., WLk_i) from the word lines WL1_i to WLy_i.

Based on the address signal output from the address buffer 2, the column decoder 4 selects one main bit line (e.g., MBLj) from the main bit lines MBL1 to MBLn. Thereby, the selected main bit line MBLj is caused to be in conduction with the read circuit 5.

The read circuit 5, which is connected to the column decoder 4, has a function of amplifying the amplitude of a signal on the bit line MBLj selected by the column decoder 4 and outputting data corresponding to a level of the main bit line MBLj to the outside, a function of precharging or discharging the selected main bit line MBLj, and a function of supplying charge to the main bit line MBLj to compensate for charge lost due to leakage. The read circuit 5 of the first embodiment outputs L-level data when the voltage of the main bit line MBLj at the H level, and H-level data when the voltage of the main bit line MBLj is at the L level.

Figure 2:
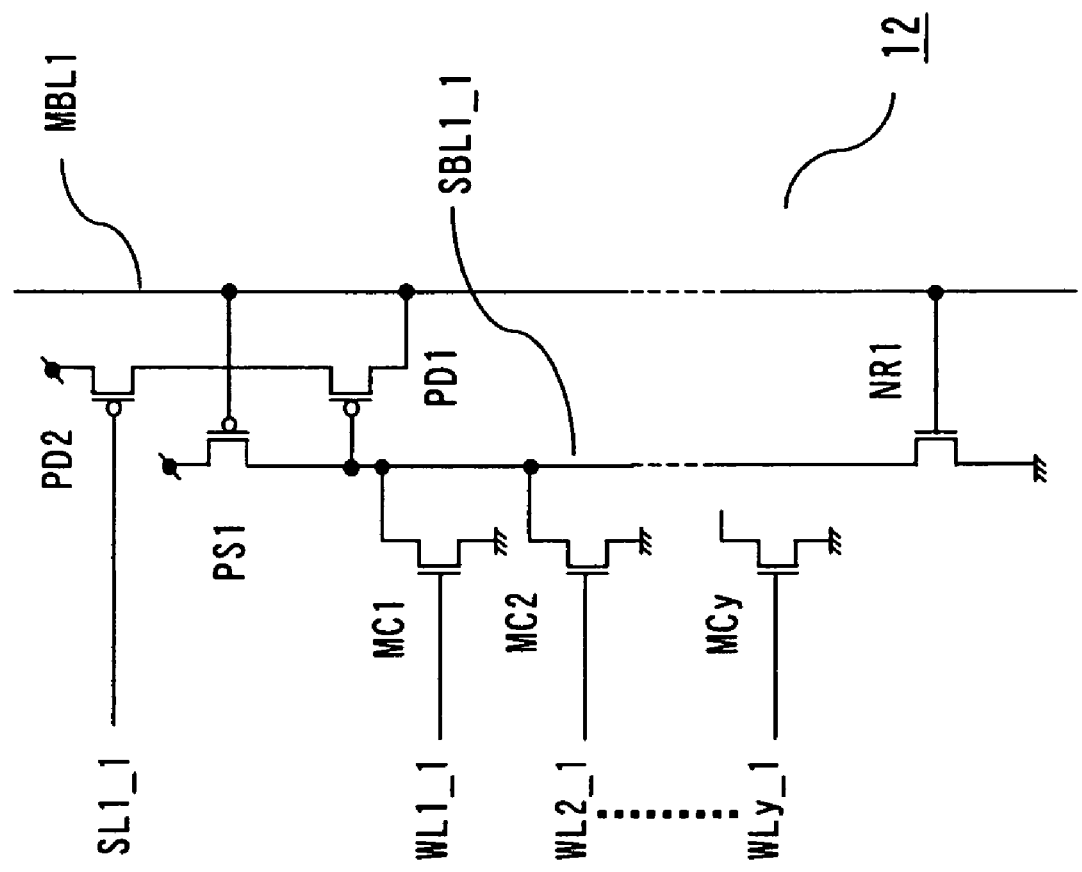
FIG. 2 is a circuit diagram illustrating a configuration of the subarray of FIG. 1.

FIG. 2 is a circuit diagram illustrating a configuration of the subarray 12 of FIG. 1. Note that, since the (m×n) subarrays 12 of FIG. 1 are similarly configured, only the subarray MS1_1 of FIG. 1 will be hereinafter described in detail. The subarray 12 of the first embodiment includes a sub-bit line SBL1_1, y memory cells MC1 to MCy, a first MOS transistor PD1, a second MOS transistor PS1, and a third MOS transistor NR1. The subarray 12 of the first embodiment further includes the block select line SL1_1 and a fourth MOS transistor PD2. The block select line SL1_1 and the fourth MOS transistor PD2 correspond to a voltage control section for controlling a voltage supplied to the subarray 12.

The memory cells MC1 to MCy each include an N-channel MOS transistor. The gate electrodes of the memory cells MC1 to MCy are connected to the word lines WL1_1 to WLy_1, respectively, and the source electrodes thereof are each connected to a ground voltage. The drain electrodes of the memory cells MC1 to MCy are each connected via a contact (not shown) to the sub-bit line SBL1_1 when data to be stored is "0", and are each not connected to the sub-bit line SBL1_1 when data to be stored is "1". For example, in the example of FIG. 2, the memory cells MC1 and MC2 store data "0", and the memory cell MCy stores data "1".

The first MOS transistor PD1, which is a P-channel MOS transistor, has a gate electrode connected to the sub-bit line SBL1_1, a source electrode connected to the voltage control section described below, and a drain electrode connected to the main bit line MBL1. The second MOS transistor PS1, which is a P-channel MOS transistor, has a gate electrode connected to the main bit line MBL1, a source electrode connected to a power source voltage, and a drain electrode connected to the sub-bit line SBL1_1. The third MOS transistor NR1, which is an N-channel MOS, whose conductivity type is different from a conductivity type of the second MOS transistor PS1, has a gate electrode connected to the main bit line MBL1, a source electrode connected to the ground voltage, and a drain electrode connected to the sub-bit line SBL1_1.

The fourth MOS transistor PD2, which is a P-channel MOS transistor, has a gate electrode connected to the block select line SL1_1, a source electrode connected to the power source voltage, and a drain electrode connected to the source electrode of the first MOS transistor PD1. The block select line SL1_1 is connected to the row decoder 3 as described above.

Figure 14:
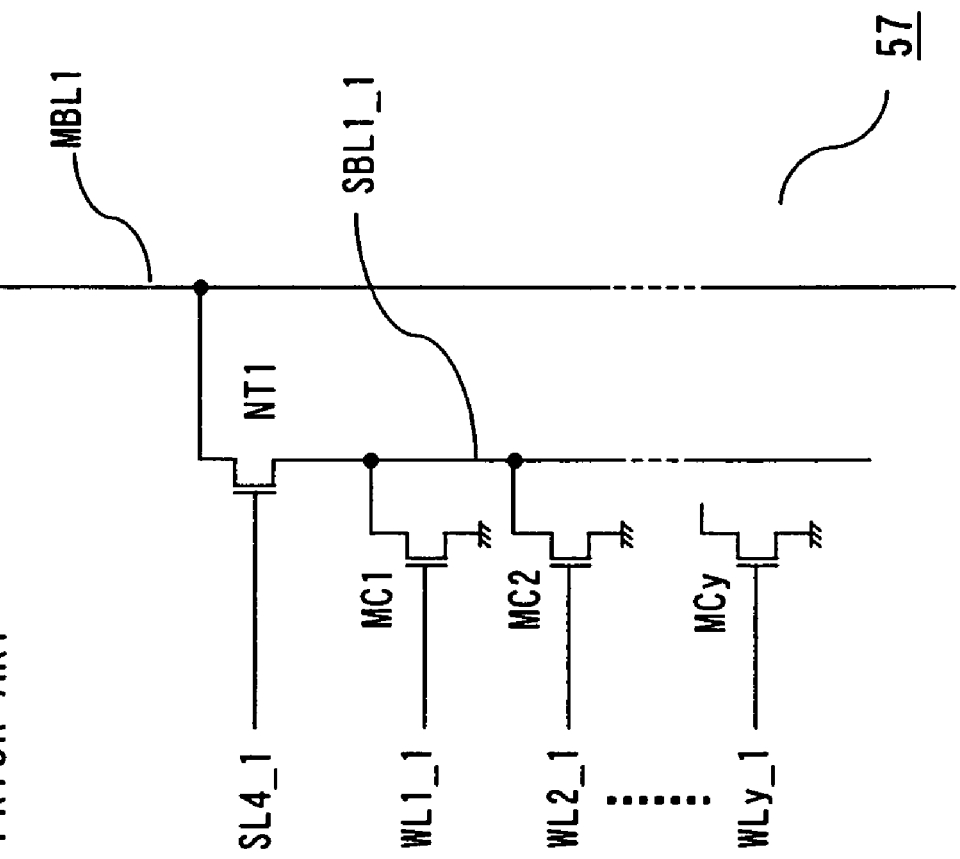
FIG. 14 is a circuit diagram illustrating a configuration of the subarray of FIG. 13.
Figure 15:
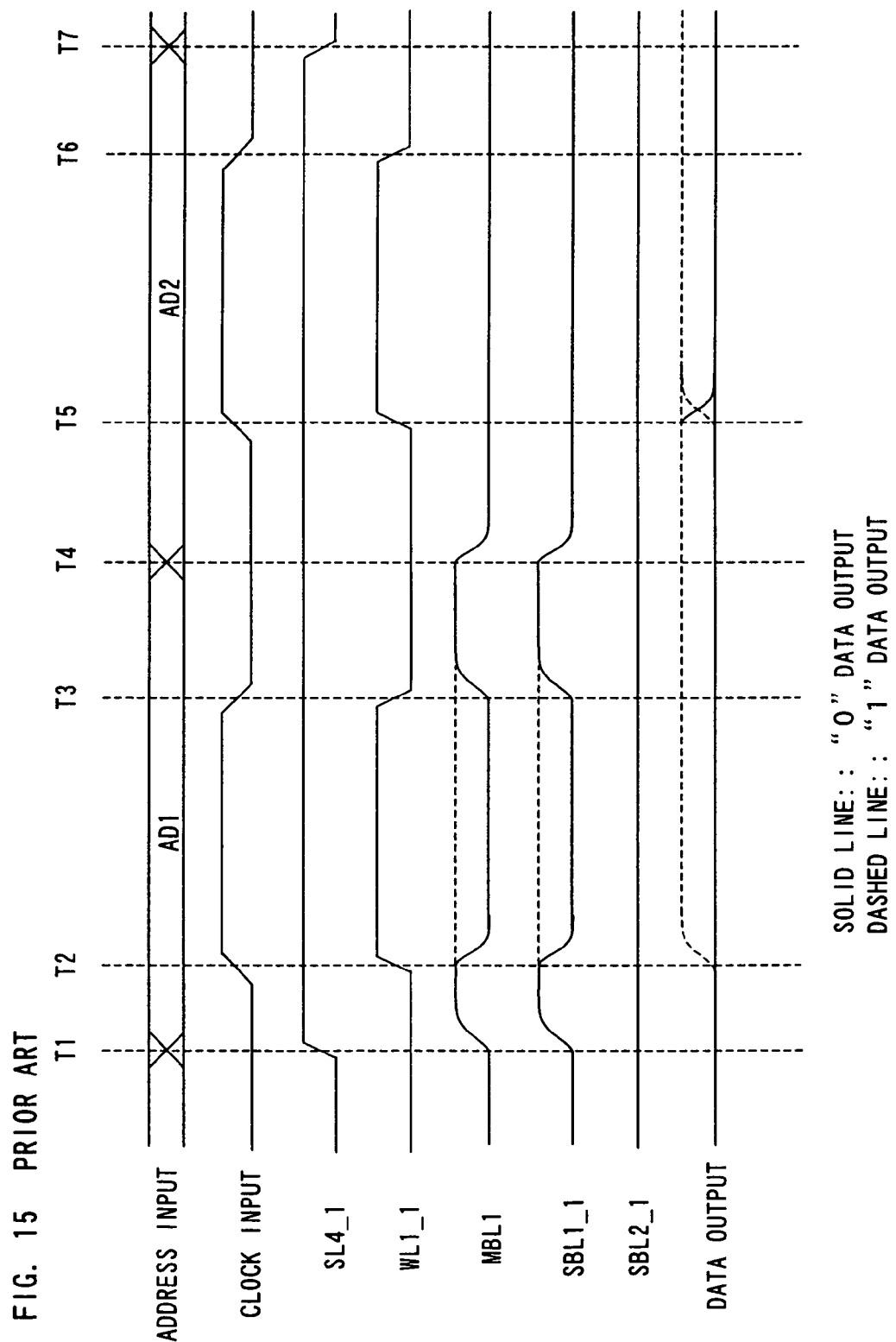
FIG. 15 is a timing diagram of the conventional semiconductor memory device of FIG. 13.

When the subarray 12 is configured in this manner, a transistor for causing the main bit line MBL1 and the sub-bit line SBL1_1 to be in conduction with each other, such as the block select transistor NT1 in the conventional example of FIG. 14, is no longer required.

Hereinafter, a data read operation of the semiconductor memory device 21 thus configured will be described.

Figure 3:
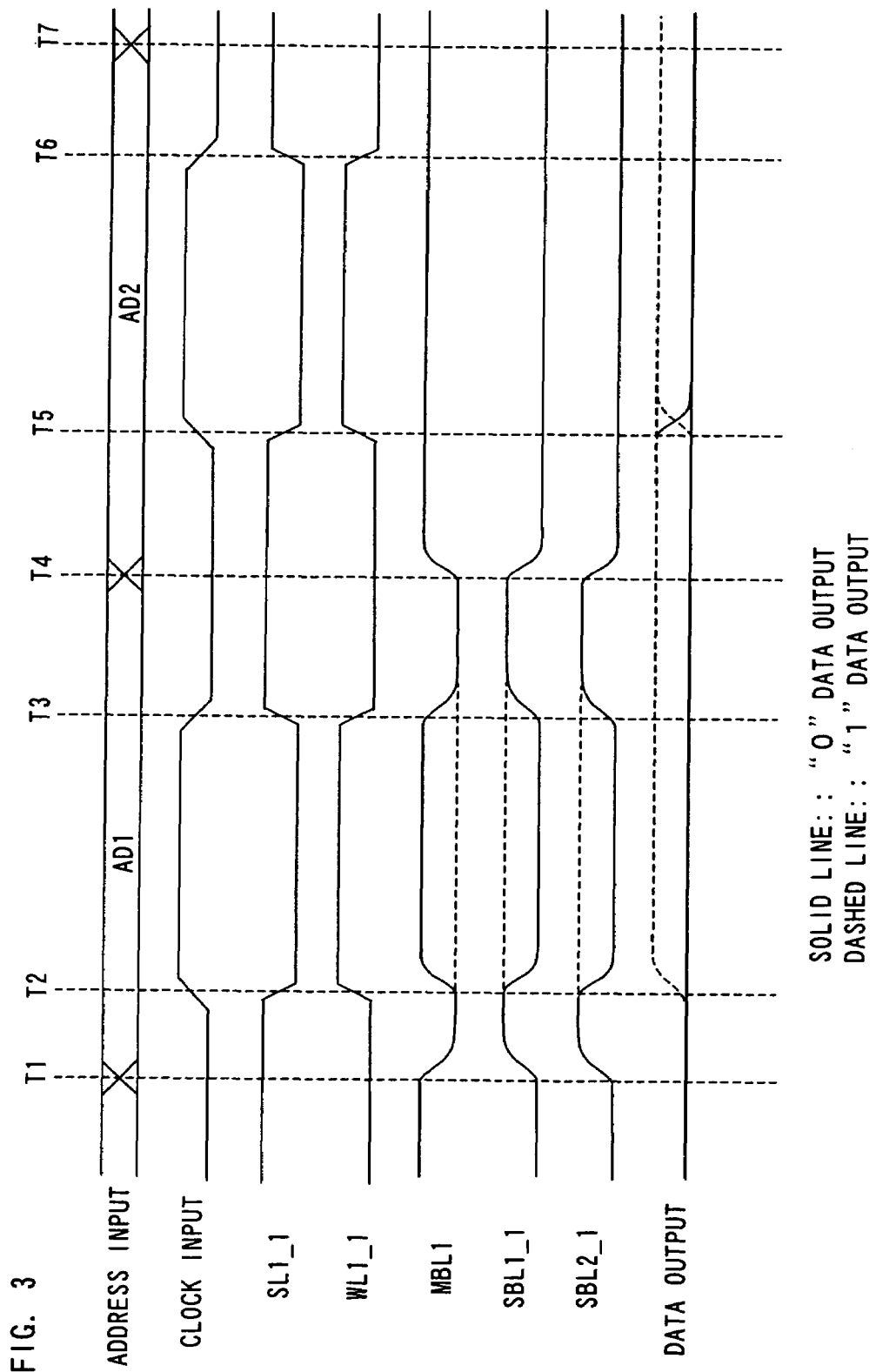
FIG. 3 is a timing diagram of the semiconductor memory device of the first embodiment of the present invention.

FIG. 3 is a timing diagram of the semiconductor memory device 21 of the first embodiment of the present invention. Note that, in FIG. 3, an address AD1 is, for example, an address which specifies the memory cell MC1 in the subarray MS1_1 of FIG. 1, and an address AD2 is, for example, an address which specifies the memory cell MC1 in another subarray (MS1_2 to MS1_m) on a column different from that of MS1_1. A time period for which a clock of FIG. 3 is at the L level is a time period for which a precharge operation is performed. A time period for which the clock is at the H level is a time period for which a read operation is performed.

(1) Time period before time T1

Referring to FIG. 3 in combination with FIG. 2, the main bit line MBL1 is held at the H level before start of a read operation. In this case, the second MOS transistor PS1 is in the OFF state and the third MOS transistor NR1 is in the ON state, and therefore, the voltage of the sub-bit line SBL1_1 is held at the L level. Also for this time period, since the word line WL1_1 is in the non-selected state, the voltage of the word line WL1_1 is at the L level. The voltage of the block select line SL1_1 is held at the H level.

(2) Time period from time T1 to time T2

When the address AD1 is inputted at time T1, the column decoder 4 selects the main bit line MBL1. Thereby, the main bit line MBL1 is caused to be in conduction with the read circuit 5 via the column decoder 4.

Next, when the read circuit 5 discharges the main bit line MBL1 by means of the discharge function thereof, the voltage of the main bit line MBL1 goes to the L level. In this case, the third MOS transistor NR1 goes to the OFF state and the second MOS transistor PS1 goes to the ON state, so that the sub-bit line SBL1_1 is charged by the power source voltage to go to the H level.

Note that, for this time period, sub-bit lines are similarly charged in the other subarrays (MS2_1 to MSm_1 in FIG. 1) connected to the main bit line MBL1, corresponding to the change in the level of the main bit line MBL1. For example, as illustrated in FIG. 3, the voltage of a sub-bit line SBL2_1 in another subarray MS2_1 transitions in a manner similar to that of the sub-bit line SBL1_1.

(3) Time period from time T2 to time T3

When the clock goes to the H level, the row decoder 3 selects the word line WL1_1 based on the input address AD1 and causes the voltage of the word line WL1_1 to go to the H level. Also, the row decoder 3 selects the block select line SL1_1 based on the input address AD1 and causes the voltage of the block select line SL1_1 to go to the L level.

When the voltage of the word line WL1_1 goes to the H level, the memory cell MC1 goes to the ON state. In this case, charge accumulated on the sub-bit line SBL1_1 is discharged via the memory cell MC1, so that the voltage of the sub-bit line SBL1_1 goes to the L level. When the sub-bit line SBL1_1 goes to the L level, the first MOS transistor PD1 goes to the ON state. When the voltage of the block select line SL1_1 goes to the L level, the fourth MOS transistor PD2 goes to the ON state.

When both the first MOS transistor PD1 and the fourth MOS transistor PD2 go to the ON state in this manner, the main bit line MBL1 is caused to be in conduction with the power source voltage via the first MOS transistor PD1 and the fourth MOS transistor PD2. Therefore, the voltage of the main bit line MBL1 goes to the H level by means of the power source voltage applied by the voltage control section. When the voltage level of the main bit line MBL1 is at the H level, the read circuit 5 outputs L-level data to the outside as illustrated with a solid line in FIG. 3. Note that, when the main bit line MBL1 is at the H level, the third MOS transistor NR1 is in the ON state and the second MOS transistor PS1 is in the OFF state. Therefore, charge accumulated on the sub-bit line SBL1_1 is discharged from the source electrode of the third MOS transistor NR1, so that the voltage of the sub-bit line SBL1_1 is held at the L level.

On the other hand, it is assumed that the drain electrode of the memory cell MC1 is not connected to the sub-bit line SBL1_1. In this case, even when the row decoder 3 selects the word line WL1_1 and causes the voltage of the word line WL1_1 to go to the H level, charge accumulated on the sub-bit line SBL1_1 is not discharged via the memory cell MC1, so that the voltage of the sub-bit line SBL1_1 is held at the H level. Therefore, the first MOS transistor PD1 is held in the OFF state. When the row decoder 3 selects the block select line SL1_1 and causes the voltage of the block select line SL1_1 to go to the L level, the fourth MOS transistor PD2 goes to the ON state.

Thus, even when the fourth MOS transistor PD2 is in the ON state, the first MOS transistor PD1 is in the OFF state, and therefore, the main bit line MBL1 is not in conduction with the power source voltage. Therefore, the voltage of the main bit line MBL1 is held at the L level. When the level of the main bit line MBL1 is at the L level, the read circuit 5 outputs H-level data to the outside as illustrated with a dashed line in FIG. 3.

(4) Time period from time T3 to time T4

After data is read out, both the main bit line MBL1 and the word line WL1_1 go to the non-selected state, i.e., go to the L level in order to be ready for the next read operation. In addition, the row decoder 3 causes the voltage of the block select line SL1_1 to go to the H level.

(5) Time period from time T4 to time T7

Thereafter, stored data is read out with respect to the address AD2 input at time T4 in a manner similar to that for the time period from time T1 to time T4. Note that, in FIG. 3, the address AD2 is an address which specifies the memory cell MC1 in a subarray MS1_i on a column different from that of the subarray MS1_1, and therefore, for a data read time period from time T5 to time T6, whereas the voltage of the block select line SL1_1 goes to the L level and the voltage of the word line WL1_1 goes to the H level, the main bit line MBL1 goes to the H level and the sub-bit lines SBL1_1 and SBL2_1 go to the L level.

According to the above-described semiconductor memory device 21, charging of the sub-bit line SBL1_1 and discharging of the main bit line MBL1 are performed using the power source voltage, and therefore, a transistor for causing the main bit line MBL1 and the sub-bit line SBL1_1 to be in conduction with each other is no longer required. Therefore, even with a low power source voltage, there is substantially no influence of the substrate bias effect, thereby making it possible to achieve a high-speed data read operation.

In the semiconductor memory device 21 of the first embodiment, one voltage control section including the block select line SL1_1 and the fourth MOS transistor PD2 is provided for each subarray 12. Alternatively, the subarrays 12 are divided into groups, and one voltage control section may be provided for each group. For example, in FIG. 1, a plurality of subarrays (MSi_1 to MSi_n) provided on the same row may share one voltage control section. If such a semiconductor memory device is configured, the number of transistors constituting a memory array can be reduced, thereby making it possible to further reduce the area of the semiconductor memory device 21.

In the first embodiment, the presence and absence of connection between the drain electrodes of the memory cells MC1 to MCy and the sub-bit line are associated with data "0" and data "1", respectively. Alternatively, the magnitudes of the threshold voltages of the MOS transistors included in the memory cells MC1 to MCy may be associated with data "0" and data "1", and all of the drain electrodes of the memory cells MC1 to MCy may be connected to the sub-bit line. More specifically, the threshold voltage of a MOS transistor corresponding to one of the data values has a magnitude which allows the MOS transistor to certainly switch between the ON state and the OFF state using a voltage applied to the word line, and the threshold voltage of a MOS transistor corresponding to the other data value has a magnitude which does not allow the MOS transistor to go to the ON state by means of a voltage applied to the word line. In a mask ROM having such a memory cell, an effect similar to that of the semiconductor memory device of the first embodiment is achieved.

Second Embodiment

Figure 4:
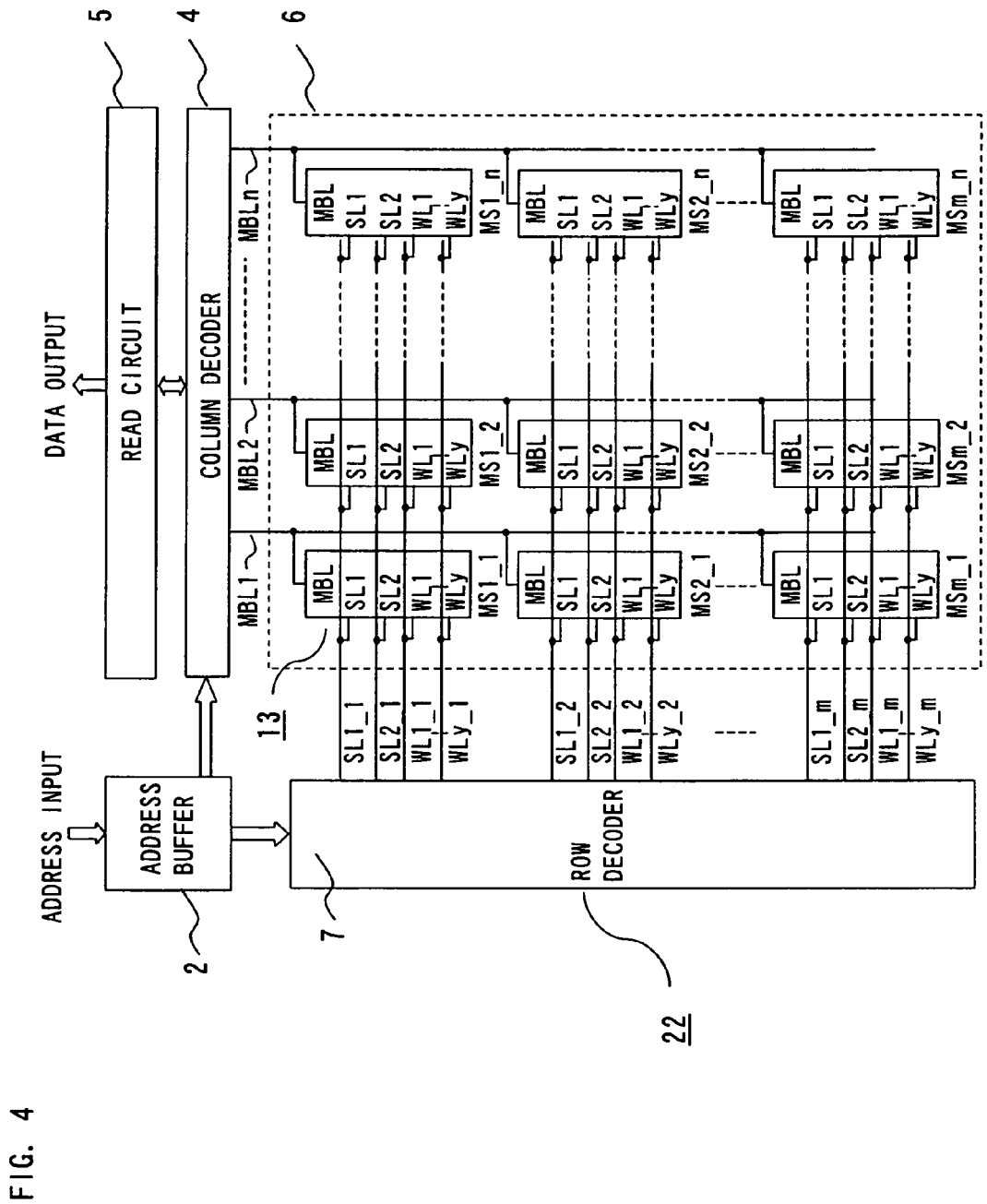
FIG. 4 is a block diagram illustrating a semiconductor memory device according to a second embodiment of the present invention.

FIG. 4 is a block diagram illustrating a semiconductor memory device according to a second embodiment of the present invention. The semiconductor memory device 22 comprises a memory cell array 6, an address buffer 2, a row decoder 7, a column decoder 4, and a read circuit 5. Note that the address buffer 2, the column decoder 4, and the read circuit 5 are configured in a manner similar to that of the first embodiment and will not be hereinafter described.

The memory cell array 6 includes (m×n) subarrays 13 (MS1_1 to MSm_n) arranged in a matrix, m first the block select lines SL1_1 to SL1_m, m second block select lines SL2_1 to SL2_m, (y×m) word lines WL1_1 to WLy_m, and n main bit lines MBL1 to MBLn. The subarrays 13 (MSi_1 to MSi_n) provided on an i-th row are each connected to the first block select line SL1_i, the second block select line SL2_i, and the word lines WL1_i to WLy_i. The subarrays 13 (MS1_j to MSm_j) provided on a j-th column are each connected to the main bit line MBLj.

Based on an address signal output from the address buffer 2, the row decoder 7 selects one first block select line (e.g., SL1_i) from the block select lines SL1_1 to SL1_m, one second block select line (e.g., SL2_i) from the second block select lines SL2_1 to SL2_m, and one word line (e.g., WLk_i) from the word lines WL1_i to WLy_i.

Figure 5:
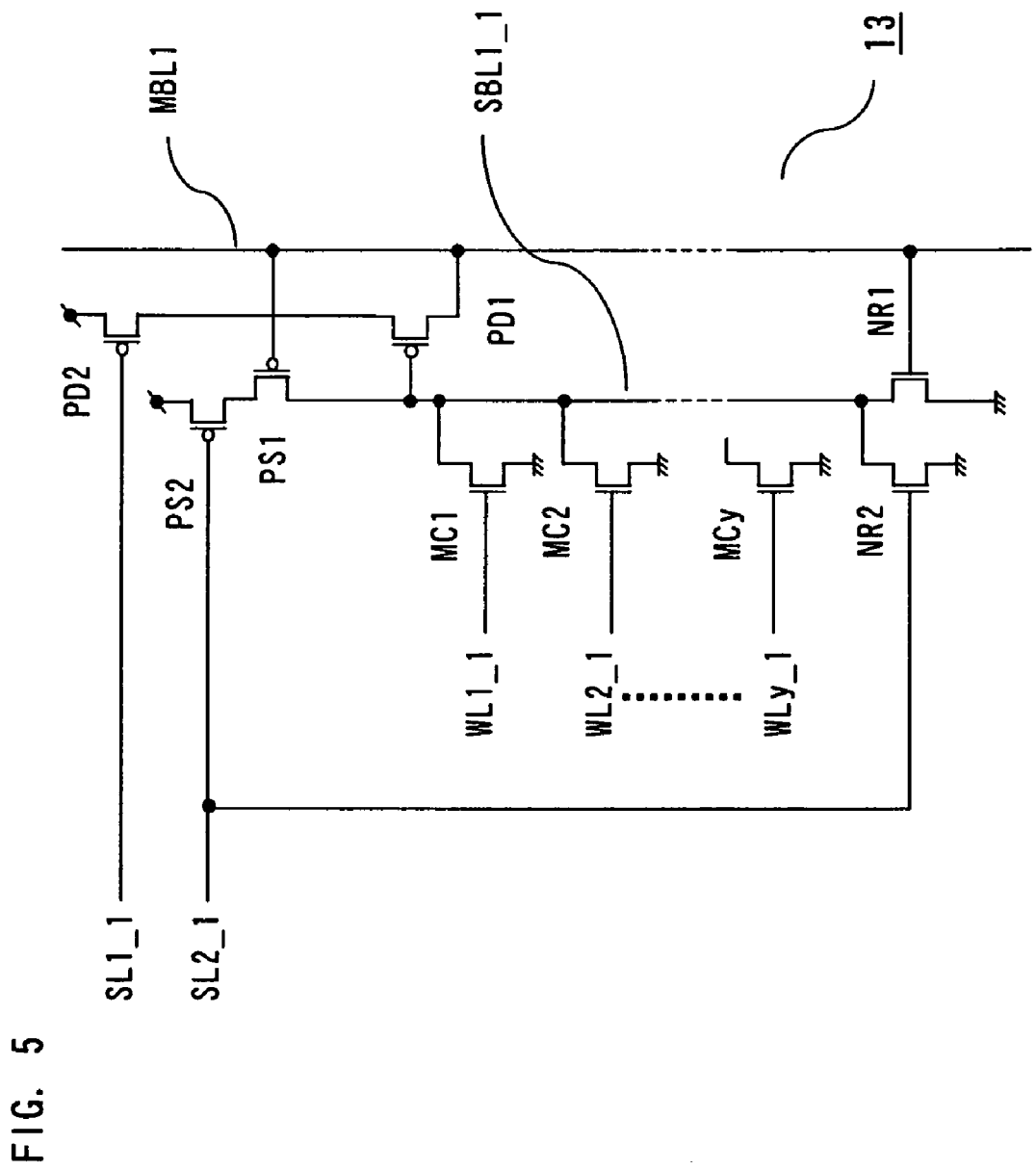
FIG. 5 is a circuit diagram illustrating a configuration of the subarray of FIG. 4.

FIG. 5 is a circuit diagram illustrating a configuration of the subarray 13 of FIG. 4. Note that all of the (m×n) subarrays 13 of FIG. 4 are similarly configured, and therefore, only the subarray MS1_1 of FIG. 4 will be hereinafter described in detail. The subarray 13 of the second embodiment includes a sub-bit line SBL1_1, y memory cells MC1 to MCy, a first MOS transistor PD1, a second MOS transistor PS1, and a third MOS transistor NR1. The subarray 13 of the second embodiment further includes the first block select line SL1_1, the second block select line SL2_1, a fourth MOS transistor PD2, a fifth MOS transistor PS2, and a sixth MOS transistor NR2. The first and second block select lines and the fourth to sixth MOS transistors correspond to a voltage control section for controlling a voltage to the subarray.

Note that the memory cells MC1 to MCy, the first MOS transistor PD1, the second MOS transistor PS1, the third MOS transistor NR1, and the fourth MOS transistor PD2 are similar to those of the first embodiment, and will not be hereinafter described.

The fifth MOS transistor PS2, which is a P-channel MOS transistor, has a gate electrode connected to the second block select line SL2_1, a source electrode connected to a power source voltage, and a drain electrode connected to the source electrode of the second MOS transistor PS1. The sixth MOS transistor NR2, which is an N-channel MOS transistor, whose conductivity type is different from a conductivity type of the fifth MOS transistor PS2, has a gate electrode connected to the second block select line SL2_1, a source electrode connected to a ground voltage, and a drain electrode connected to the sub-bit line SBL1_1. Note that the first block select line SL1_1, the second block select line SL2_1, and the word lines WL1_1 to WLy_1 are each connected to the row decoder 7.

In the second embodiment, the current drive capability of each of the second MOS transistor PS1 and the fifth MOS transistor PS2, which are connected in series with each other, is larger than a total amount of off leakage currents of the memory cells MC1 to MCy corresponding to the sub-bit line SBL1_1 and is smaller than the current drive capability of one memory cell (e.g. MCk).

Figure 6:
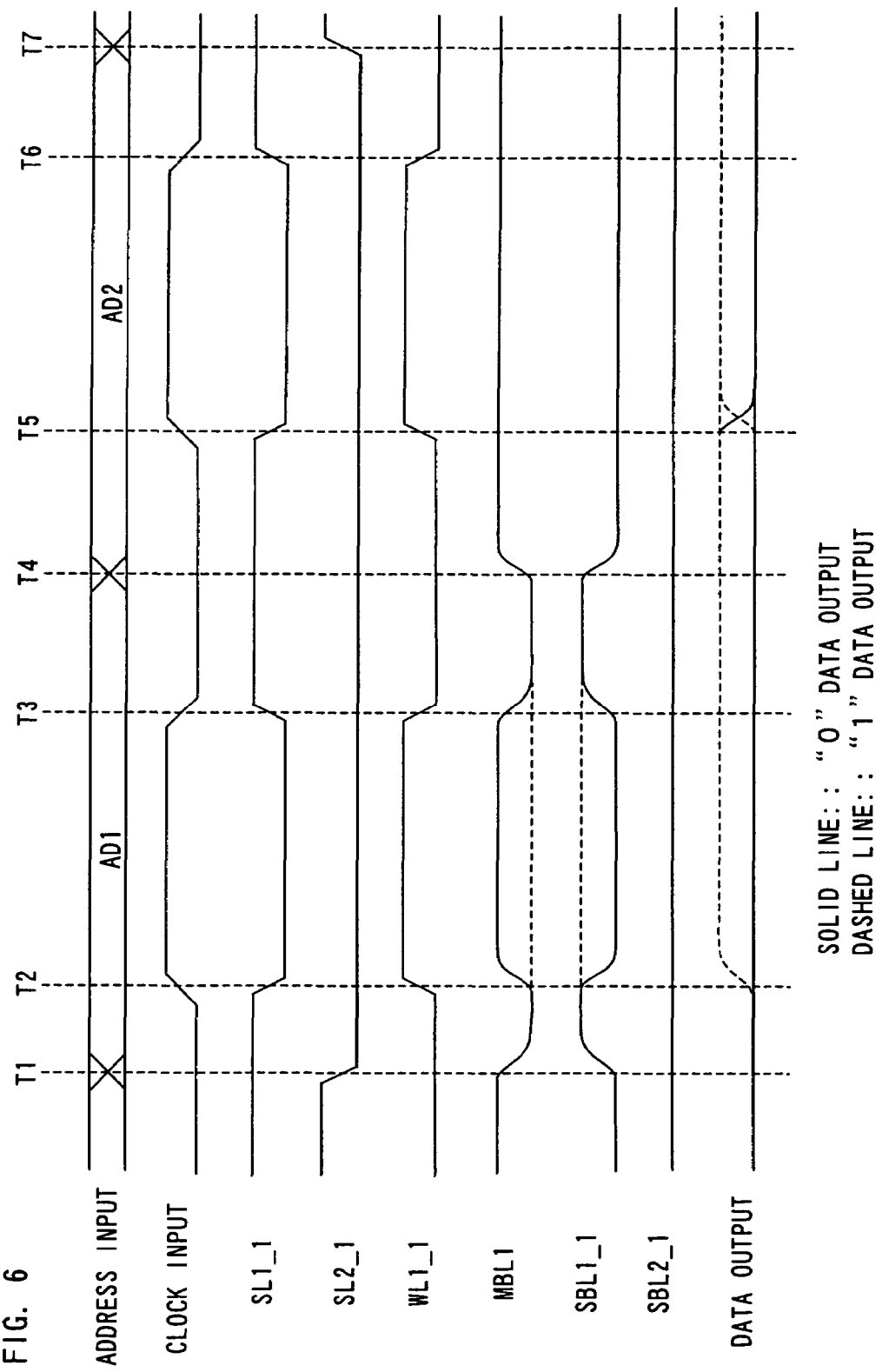
FIG. 6 is a timing diagram of the semiconductor memory device of the second embodiment of the present invention.

FIG. 6 is a timing diagram of the semiconductor memory device 22 of the second embodiment of the present invention. Note that, in FIG. 6, an address AD1 is, for example, an address which specifies the memory cell MC1 in the subarray MS1_1 of FIG. 4, and an address AD2 is, for example, an address which specifies the memory cell MC1 in another subarray (MS1_2 to MS1_m) on a column different from that of MS1_1. A time period for which a clock of FIG. 6 is at the L level is a time period for which a precharge operation is performed. A time period for which the clock is at the H level is a time period for which a read operation is performed.

(1) Time period before time T1

Referring to FIG. 6 in combination with FIG. 5, the main bit line MBL1 is held at the H level before start of a read operation. In this case, the second MOS transistor PS1 is in the OFF state and the third MOS transistor NR1 is in the ON state, and therefore, the voltage of the sub-bit line SBL1_1 is held at the L level. Also for this time period, since the word line WL1_1 is in the non-selected state, the voltage of the word line WL1_1 is at the L level. Since the voltage of the first block select line SL1_1 is held at the H level, the fourth MOS transistor PD2 is in the OFF state. Since the voltage of the second block select line SL2_1 is held at the H level, the fifth MOS transistor PS2 is in the OFF state and the sixth MOS transistor NR2 is in the ON state.

(2) Time period from time T1 to time T2

Initially, when the address AD1 is inputted at time T1, the column decoder 4 selects the main bit line MBL1. Thereby, the main bit line MBL1 is caused to be in conduction with the read circuit 5 via the column decoder 4.

Next, the read circuit 5 discharges the main bit line MBL1 by the discharge function thereof to cause the voltage of the main bit line MBL1 to go to the L level, and the row decoder 7 causes the voltage of the second block select line SL2_1 to go to the L level based on the input address AD1. When the voltage of the main bit line MBL1 goes to the L level, the second MOS transistor PS1 goes to the ON state and the third MOS transistor NR1 goes to the OFF state. When the voltage of the second block select line SL2_1 goes to the L level, the fifth MOS transistor PS2 goes to the ON state and the sixth MOS transistor NR2 goes to the OFF state. In this case, the sub-bit line SBL1_1 is charged via the second MOS transistor PS1 and the fifth MOS transistor PS2 by the power source voltage, so that the voltage of the sub-bit line SBL1_1 goes to the H level.

Note that, since the voltages of the other second block select lines (SL2_2 to SL2_m in FIG. 4) are held at the H level, the fifth MOS transistor PS2 is in the OFF state and the sixth MOS transistor NR2 is in the ON state in the other subarrays 13 (MS2_1 to MSm_1 in FIG. 4) connected to the main bit lines MBL1. Thereby, the voltages of the sub-bit lines SBL2_1 to SBLm_1 included in the subarrays MS2_1 to MSm_1 connected to the main bit line MBL1 are held at the L level. For example, as illustrated in FIG. 6, for this time period, the voltage of the sub-bit line SBL2_1 included in the subarray MS2_1 is held at the L level.

(3) Time period from time T2 to time T3

When the clock goes to the H level, the row decoder 7 selects the word line WL1_1 based on the input address AD1 and causes the voltage of the word line WL1_1 to go to the H level. The row decoder 7 also selects the first block select line SL1_1 based on the input address AD1 and causes the voltage of the first block select line SL1_1 to go to the L level.

When the voltage of the word line WL1_1 goes to the H level, the memory cell MC1 goes to the ON state. In this case, charge accumulated on the sub-bit line SBL1_1 is discharged via the memory cell MC1, so that the voltage of the sub-bit line SBL1_1 goes to the L level. When the sub-bit line SBL1_1 goes to the L level, the first MOS transistor PD1 goes to the ON state. When the voltage of the block select line SL1_1 goes to the L level, the fourth MOS transistor PD2 goes to the ON state.

When both the first MOS transistor PD1 and the fourth MOS transistor PD2 go to the ON state in this manner, the main bit line MBL1 is caused to be in conduction with the power source voltage via the first MOS transistor PD1 and the fourth MOS transistor PD2. Therefore, the voltage of the main bit line MBL1 goes to the H level by means of the power source voltage applied by the voltage control section. When the voltage level of the main bit line MBL1 is at the H level, the read circuit 5 outputs L-level data to the outside as illustrated with a solid line in FIG. 6. Note that, when the main bit line MBL1 is at the H level, the third MOS transistor NR1 is in the ON state and the second MOS transistor PS1 is in the OFF state. Therefore, charge accumulated on the sub-bit line SBL1_1 is discharged through the source electrode of the third MOS transistor NR1, so that the voltage of the sub-bit line SBL1_1 is held at the L level.

On the other hand, it is assumed that the drain electrode of the memory cell MC1 is not connected to the sub-bit line SBL1_1. In this case, even when the row decoder 7 selects the word line WL1_1 and causes the voltage of the word line WL1_1 to go to the H level, charge accumulated on the sub-bit line SBL1_1 is not discharged via the memory cell MC1, so that the voltage of the sub-bit line SBL1_1 is held at the H level. Therefore, the first MOS transistor PD1 is held in the OFF state. When the row decoder 7 selects the block select line SL1_1 and causes the voltage of the block select line SL1_1 to go to the L level, the fourth MOS transistor PD2 goes to the ON state.

Thus, even when the fourth MOS transistor PD2 is in the ON state, since the first MOS transistor PD1 is in the OFF state, the main bit line MBL1 is not in conduction with the power source voltage. Therefore, the voltage of the main bit line MBL1 is held at the L level. When the voltage of the main bit line MBL1 is at the L level, the read circuit 5 outputs H-level data to the outside as illustrated with a dashed line in FIG. 6.

(4) Time period from time T3 to time T4

After data is read out, both the main bit line MBL1 and the word line WL1_1 go to the non-selected state, i.e., go to the L level in order to be ready for the next read operation. In addition, the row decoder 7 causes the voltage of the block select line SL1_1 to go to the H level.

(5) Time period from time T4 to time T7

Thereafter, stored data is read out with respect to the address AD2 input at time T4 in a manner similar to that for the time period from time T1 to time T4. Note that, in FIG. 6, the address AD2 is an address which specifies the memory cell MC1 in a subarray MS1_i on a column different from that of the subarray MS1_1, and therefore, for a data read time period from time T5 to time T6, whereas the voltage of the block select line SL1_1 goes to the L level and the voltage of the word line WL1_1 goes to the H level, the main bit line MBL1 goes to the H level and the sub-bit lines SBL1_1 and SBL2_1 go to the L level.

According to the above-described semiconductor memory device 22, charging of the sub-bit line SBL1_1 and discharging of the main bit line MBL1 are performed using the power source voltage, and therefore, a transistor for causing the main bit line MBL1 and the sub-bit line SBL1_1 to be in conduction with each other is no longer required. Therefore, even with a low power source voltage, there is substantially no influence of the substrate bias effect, thereby making it possible to achieve a high-speed data read operation.

In addition, in the semiconductor memory device 22 of the second embodiment, the second block select line, the fifth MOS transistor PS2, and the sixth MOS transistor NR2 are additionally required as compared to the first embodiment, but the voltage of the sub-bit line in a subarray(s) in the non-selected state among a plurality of subarrays connected to a single main bit line can be held at the L level, thereby making it possible to reduce power consumption.

In the semiconductor memory device 22 of the second embodiment, one voltage control section including the first and second block select lines and the fourth to sixth MOS transistors are provided for each subarray 13. Alternatively, the subarrays 13 are divided into groups, and one voltage control section may be provided for each group. For example, in FIG. 4, if a plurality of subarrays (MSi_1 to MSi_n) provided on the same row share one voltage control section, the number of transistors constituting a memory array can be reduced, thereby making it possible to further reduce the area of the semiconductor memory device 22.

In the second embodiment, the presence and absence of connection between the drain electrodes of the memory cells MC1 to MCy and the sub-bit line are associated with data "0" and data "1", respectively. Alternatively, the magnitudes of the threshold voltages of the MOS transistors included in the memory cells MC1 to MCy may be associated with data "0" and data "1", and all of the drain electrodes of the memory cells MC1 to MCy may be connected to the sub-bit line. More specifically, the threshold voltage of a MOS transistor corresponding to one of the data values has a magnitude which allows the MOS transistor to certainly switch between the ON state and the OFF state using a voltage applied to the word line, and the threshold voltage of a MOS transistor corresponding to the other data value has a magnitude which does not allow the MOS transistor to go to the ON state by means of a voltage applied to the word line. In a mask ROM having such a memory cell, an effect similar to that of the semiconductor memory device of the second embodiment is achieved.

Third Embodiment

Figure 7:
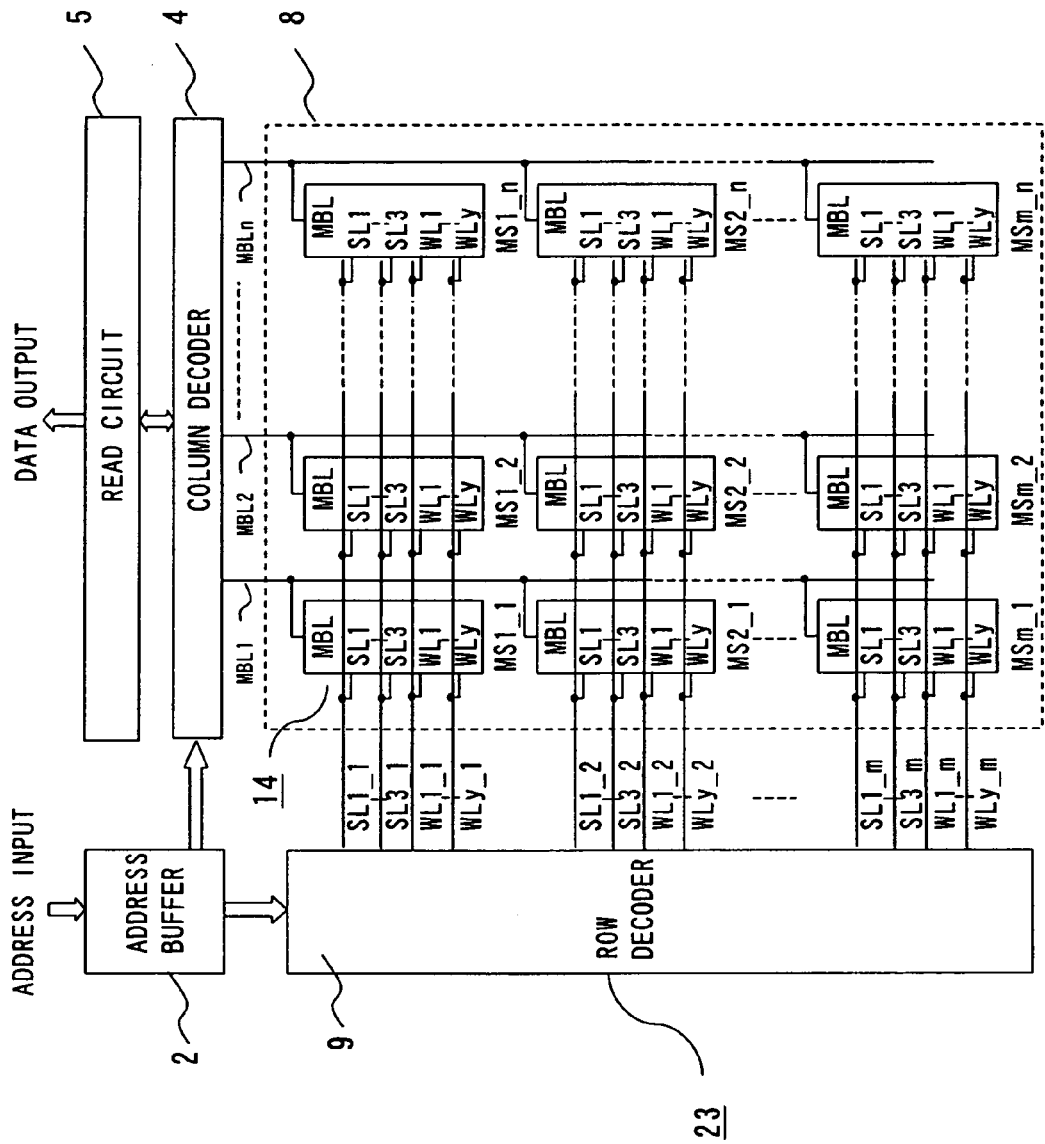
FIG. 7 is a block diagram illustrating a configuration of a semiconductor memory device according to a third embodiment of the present invention.

FIG. 7 is a block diagram illustrating a configuration of a semiconductor memory device according to a third embodiment of the present invention. The semiconductor memory device 23 comprises a memory cell array 8, an address buffer 2, a row decoder 9, a column decoder 4, and a read circuit 5. Note that the address buffer 2, the column decoder 4, and the read circuit 5 are configured in a manner similar to that of the first embodiment, and will not be hereinafter described.

The memory cell array 8 includes (m×n) subarrays 14 (MS1_1 to MSm_n) arranged in a matrix, m first block select lines SL1_1 to SL1_m, m second block select lines SL2_1 to SL2_m (not shown), m third block select lines SL3_1 to SL3_m, (y×m) word lines WL1_1 to WLy_m, and n main bit lines MBL1 to MBLn. The subarrays 14 (MSi_1 to MSi_n) provided on an i-th row are each connected to the first block select line SL1_i, the second block select line SL2_i, the third block select line SL3_i, and the word lines WL1_i to WLy_i. The subarrays 14 (MS1_j to MSm_j) provided on a j-th column are each connected to the main bit line MBLj.

Based on an address signal output from the address buffer 2, the row decoder 9 selects one first block select line (e.g., SL1_i) from the block select lines SL1_1 to SL1_m, one second block select line (e.g., SL2_i) from the second block select lines SL2_1 to SL2_m, one third block select line (e.g., SL3_i) from the third block select lines SL3_1 to SL3_m, and one word line (e.g., WLk_i) from the word lines WL1_i to WLy_i.

Figure 8:
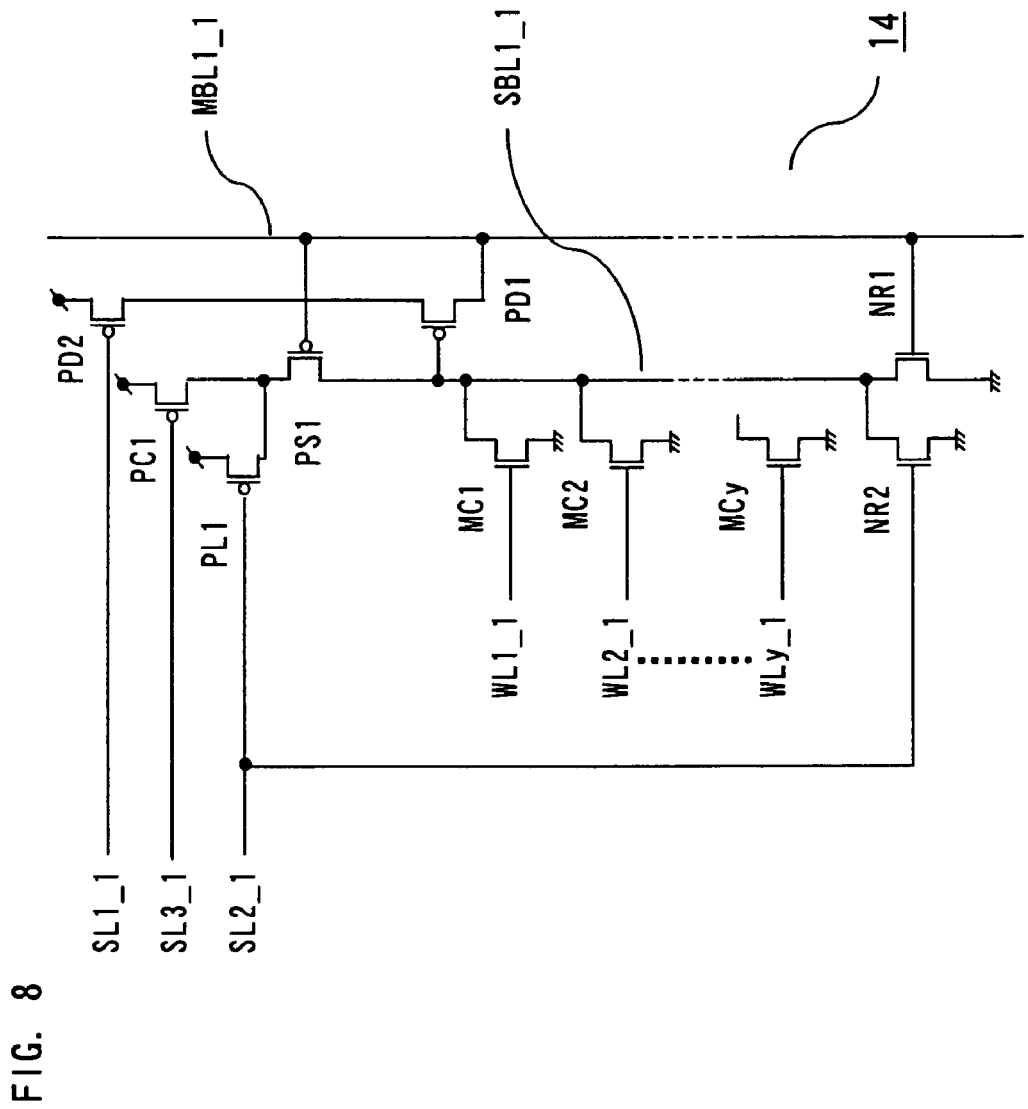
FIG. 8 is a circuit diagram illustrating a configuration of the subarray of FIG. 7.

FIG. 8 is a circuit diagram illustrating a configuration of the subarray 14 of FIG. 7. Note that all of the (m×n) subarrays 14 of FIG. 7 are similarly configured, and only the subarray MS1_1 of FIG. 7 will be described in detail. The subarray 14 of the third embodiment includes a sub-bit line SBL1_1, y memory cells MC1 to MCy, a first MOS transistor PD1, a second MOS transistor PS1, and a third MOS transistor NR1. The subarray 14 of the third embodiment further includes a first block select line SL1_1, a second block select line SL2_1, a third block select line SL3_1, a fourth MOS transistor PD2, a fifth MOS transistor PL1, a sixth MOS transistor NR2, and a seventh MOS transistor PC1. The first to third block select lines and the fourth to seventh MOS transistors correspond to a voltage control section for controlling a voltage supplied to the subarray 14.

Note that the memory cells MC1 to MCy, the first MOS transistor PD1, the second MOS transistor PS1, the third MOS transistor NR1, the fourth MOS transistor PD2, and the sixth MOS transistor NR2 are similar to those of the second embodiment, and will not be hereinafter described.

The fifth MOS transistor PL1, which is a P-channel MOS transistor, has a gate electrode connected to the second block select line SL2_1, a source electrode connected to a power source voltage, and a drain electrode connected to the source electrode of the second MOS transistor PS1. The seventh MOS transistor PC1, which is a P-channel MOS transistor, has a gate electrode connected to the third block select line SL3_1, a source electrode connected to the power source voltage, and a drain electrode connected to the source electrode of the second MOS transistor PS1. Note that the first to third the block select lines SL1_1 to SL3_1 and the word lines WL1_1 to WLy_1 are connected to the row decoder 9.

In the third embodiment, the current drive capability of each of the second MOS transistor PS1 and the fifth MOS transistor PL1, which are connected in series with each other, is larger than a total amount of off leakage currents of the memory cells MC1 to MCy connected to the sub-bit line SBL1_1 and is smaller than the current drive capability of one memory cell (e.g., MCk).

Figure 9:
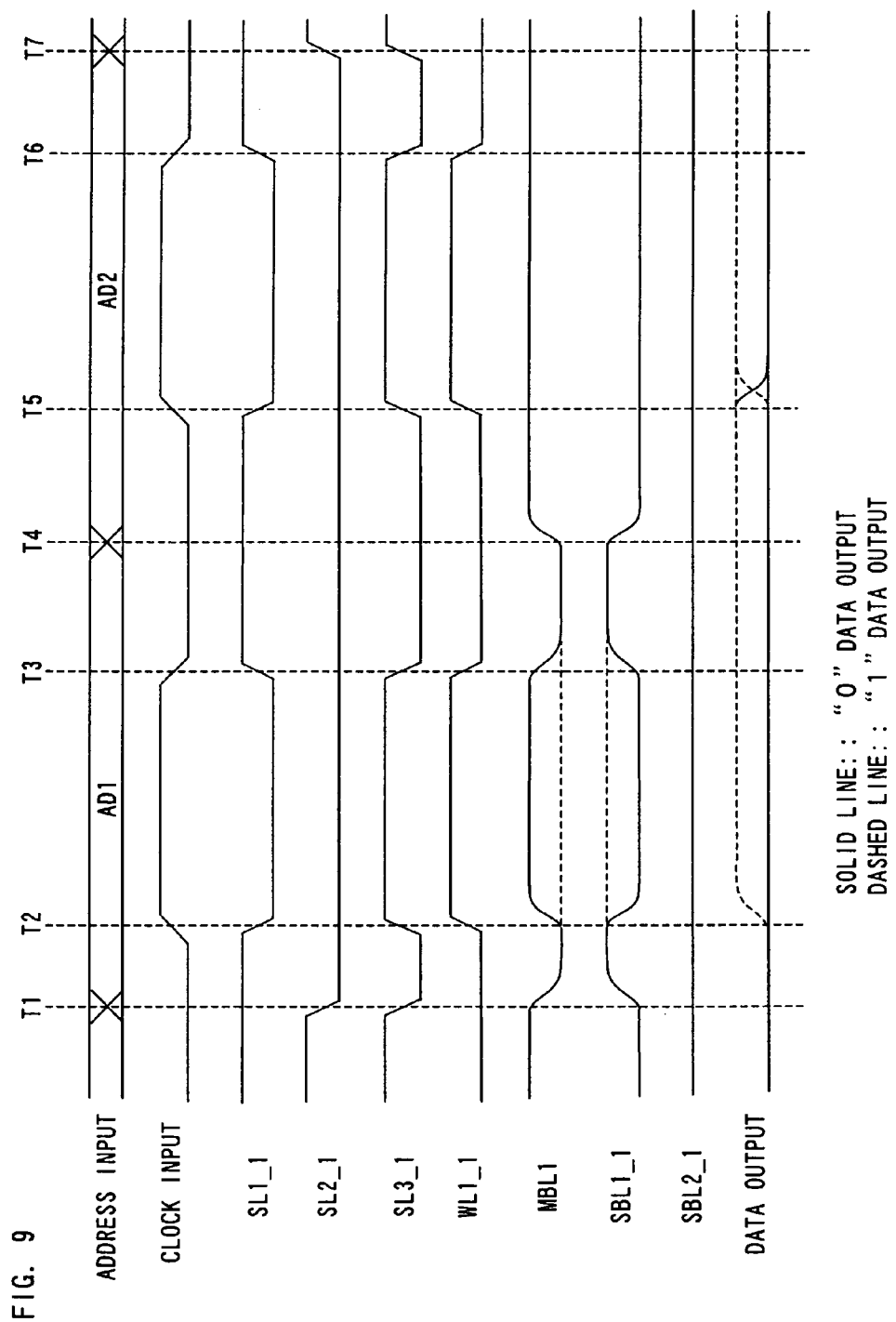
FIG. 9 is a timing diagram of the semiconductor memory device of the third embodiment of the present invention.

FIG. 9 is a timing diagram of the semiconductor memory device 23 of the third embodiment of the present invention. Note that, in FIG. 9, an address AD1 is, for example, an address which specifies the memory cell MC1 in the sub-array MS1_1 of FIG. 7, and an address AD2 is, for example, an address which specifies the memory cell MC1 in another subarray (MS1_2 to MS1_m) on a column different from that of MS1_1. A time period for which a clock of FIG. 9 is at the L level is a time period for which a precharge operation is performed. A time period for which the clock is at the H level is a time period for which a read operation is performed.

(1) Time period before time T1

Referring to FIG. 9 in combination with FIG. 8, the main bit line MBL1 is held at the H level before start of a read operation. In this case, the second MOS transistor PS1 is in the OFF state and the third MOS transistor NR1 is in the ON state, and therefore, the voltage of the sub-bit line SBL1_1 is held at the L level. Also for this time period, since the word line WL1_1 is in the non-selected state, the voltage of the word line WL1_1 is at the L level. Since the voltage of the first block select line SL1_1 is held at the H level, the fourth MOS transistor PD2 is in the OFF state. Since the voltage of the second block select line SL2_1 is held at the H level, the fifth MOS transistor PL1 is in the OFF state and the sixth MOS transistor NR2 is in the ON state. Further, since the third block select line SL3_1 is held at the H level, the seventh MOS transistor PC1 is in the OFF state.

(2) Time period from time T1 to time T2

Initially, when the address AD1 is inputted at time T1, the column decoder 4 selects the main bit line MBL1. Thereby, the main bit line MBL1 is caused to be in conduction with the read circuit 5 via the column decoder 4.

Next, based on the input address AD1, the row decoder 9 causes each of the voltage of the second block select line SL2_1 and the voltage of the third block select line SL3_1 to go to the L level. When the voltage of the second block select line SL2_1 goes to the L level, the fifth MOS transistor PL1 goes to the ON state and the sixth MOS transistor NR2 goes to the OFF state. When the voltage of the third block select line SL3_1 goes to the L level, the seventh MOS transistor PC1 goes to the ON state.

Next, the read circuit 5 discharges the main bit line MBL1 by the discharge function thereof to cause the voltage of the main bit line MBL1 to go to the L level. When the voltage of the main bit line MBL1 goes to the L level, the second MOS transistor PS1 goes to the ON state and the third MOS transistor NR1 goes to the OFF state.

In this case, all of the second MOS transistor PS1, the fifth MOS transistor PL1, and the seventh MOS transistor PC1 go to the ON state, the sub-bit line SBL1_1 is caused to be in conduction with the power source voltage connected to the source electrode of the fifth MOS transistor PL1 and the power source voltage connected to the source electrode of the seventh MOS transistor PC1. Therefore, the sub-bit line SBL1_1 is charged via the second MOS transistor PS1, the fifth MOS transistor PL1, and the seventh MOS transistor PC1 by the power source voltage, so that the voltage of the sub-bit line SBL1_1 goes to the H level.

Note that, since the voltages of the other second block select lines (SL2_2 to SL2_m in FIG. 7) and the other third block select lines (SL3_2 to SL3_m in FIG. 7) are held at the H level, the fifth MOS transistor PL1 is in the OFF state and the sixth MOS transistor NR2 is in the ON state in the other subarrays (MS2_1 to MSm_1 of FIG. 7) connected to the main bit line MBL1. Therefore, the voltages of the sub-bit lines SBL2_1 to SBLm_1 in the other subarrays MS2_1 to MSm_1 connected to the main bit line MBL1 are held at the L level. For example, as illustrated in FIG. 9, for this time period, the voltage of the sub-bit line SBL2_1 included in the subarray MS2_1 is held at the L level.

(3) Time period from time T2 to time T3

When the clock goes to the H level, the row decoder 9 selects the word line WL1_1 based on the input address AD1 and causes the voltage of the word line WL1_1 to go to the H level. Based on the input address AD1, the row decoder 9 also causes the voltage of the first block select line SL1_1 to go to the L level, and the voltage of the third block select line SL3_1 to go to the H level.

When the voltage of the word line WL1_1 goes to the H level, the memory cell MC1 goes to the ON state. In this case, charge accumulated on the sub-bit line SBL1_1 is discharged via the memory cell MC1, so that the voltage of the sub-bit line SBL1_1 goes to the L level. When the sub-bit line SBL1_1 goes to the L level, the first MOS transistor PD1 goes to the ON state. When the voltage of the first block select line SL1_1 goes to the L level, the fourth MOS transistor PD2 goes to the ON state. When the voltage of the third block select line SL3_1 goes to the H level, the seventh MOS transistor PC1 goes to the OFF state.

Thus, when both the first MOS transistor PD1 and the fourth MOS transistor PD2 go to the ON state, the main bit line MBL1 is caused to be in conduction with the power source voltage via the first MOS transistor PD1 and the fourth MOS transistor PD2. Therefore, the voltage of the main bit line MBL1 goes to the H level. When the voltage level of the main bit line MBL1 is at the H level, the read circuit 5 outputs L-level data to the outside as illustrated with a solid line in FIG. 9. Note that, when the main bit line MBL1 is at the H level, the third MOS transistor NR1 is in the ON state and the second MOS transistor PS1 is in the OFF state. Therefore, charge accumulated on the sub-bit line SBL1_1 is discharged through the source electrode of the third MOS transistor NR1, so that the voltage of the sub-bit line SBL1$_{13}$ 1 is held at the L level.

On the other hand, it is assumed that the drain electrode of the memory cell MC1 is not connected to the sub-bit line SBL1_1. In this case, even when the row decoder 9 selects the word line WL1_1 and causes the voltage of the word line WL1_1 to go to the H level, charge accumulated on the sub-bit line SBL1_1 is not discharged via the memory cell MC1, so that the voltage of the sub-bit line SBL1_1 is held at the H level. Thereby, the first MOS transistor PD1 is held in the OFF state. When the row decoder 9 selects the block select line SL1_1 and causes the voltage of the block select line SL1_1 to go to the L level, the fourth MOS transistor PD2 goes to the ON state.

Thus, even when the fourth MOS transistor PD2 is in the ON state, the first MOS transistor PD1 is in the OFF state, so that the main bit line MBL1 is not in conduction with the power source voltage. Therefore, the voltage of the main bit line MBL1 is held at the L level. As a result, when the level of the main bit line MBL1 is at the L level, the read circuit 5 outputs H-level data to the outside as illustrated with a dashed line in FIG. 9.

(4) Time period from time T3 to time T4

After data is read out, both the main bit line MBL1 and the word line WL1_1 go to the non-selected state, i.e., go to the L level in order to be ready for the next read operation. In addition, the row decoder 9 causes the voltage of the first block select line SL1_1 to go to the H level, and the voltage of the third block select line SL3_1 to go to the L level.

(5) Time period from time T4 to time T7

Thereafter, stored data is read out with respect to the address AD2 input at time T4 in a manner similar to that for the time period from time T1 to time T4. Note that, in FIG. 9, the address AD2 is an address which specifies the memory cell MC1 in a subarray MS1_i on a column different from that of the subarray MS1_1, and therefore, for a data read time period from time T5 to time T6, whereas the voltage of the block select line SL1_1 goes to the L level and the voltages of the word line WL1_1 and the third block select line SL3_1 go to the H level, the main bit line MBL1 goes to the H level and the sub-bit lines SBL1_1 and SBL2_1 go to the L level.

According to the above-described semiconductor memory device 23, charging of the sub-bit line SBL1_1 and discharging of the main bit line MBL1 are performed using the power source voltage, and therefore, a transistor for causing the main bit line MBL1 and the sub-bit line SBL1_1 to be in conduction with each other is no longer required. Therefore, even with a low power source voltage, there is substantially no influence of the substrate bias effect, thereby making it possible to achieve a high-speed data read operation.

In the semiconductor memory device 23 of the second embodiment, the second and third block select lines and the fifth to seventh MOS transistors are additionally required as compared to the first embodiment, but the voltage of the sub-bit line in a subarray(s) in the non-selected state among a plurality of subarrays connected to a single main bit line can be held at the L level, thereby making it possible to reduce power consumption.

In addition, in the semiconductor memory device 23 of the third embodiment, the current drive capability of charging the sub-bit line can be increased, thereby making it possible to charge the sub-bit line SBL1_1 with higher speed.

In the semiconductor memory device 23 of the third embodiment, one voltage control section including the first to third block select lines and the fourth to seventh MOS transistors are provided for each subarray 14. Alternatively, the subarrays 14 are divided into groups, and one voltage control section may be provided for each group. For example, in FIG. 7, if a plurality of subarrays (MSi_1 to MSi_n) provided on the same row share one voltage control section, the number of transistors constituting the memory array 9 can be reduced, thereby making it possible to further reduce the area of the semiconductor memory device 23.

In the third embodiment, the presence and absence of connection between the drain electrodes of the memory cells MC1 to MCy and the sub-bit line are associated with data "0" and data "1", respectively. Alternatively, the magnitudes of the threshold voltages of the MOS transistors included in the memory cells MC1 to MCy may be associated with data "0" and data "1", and all of the drain electrodes of the memory cells MC1 to MCy may be connected to the sub-bit line. More specifically, the threshold voltage of a MOS transistor corresponding to one of the data values has a magnitude which allows the MOS transistor to certainly switch between the ON state and the OFF state using a voltage applied to the word line, and the threshold voltage of a MOS transistor corresponding to the other data value has a magnitude which does not allow the MOS transistor to go to the ON state by means of a voltage applied to the word line. In a mask ROM having such a memory cell, an effect similar to that of the semiconductor memory device of the third embodiment is achieved.

Fourth Embodiment

Figure 10:
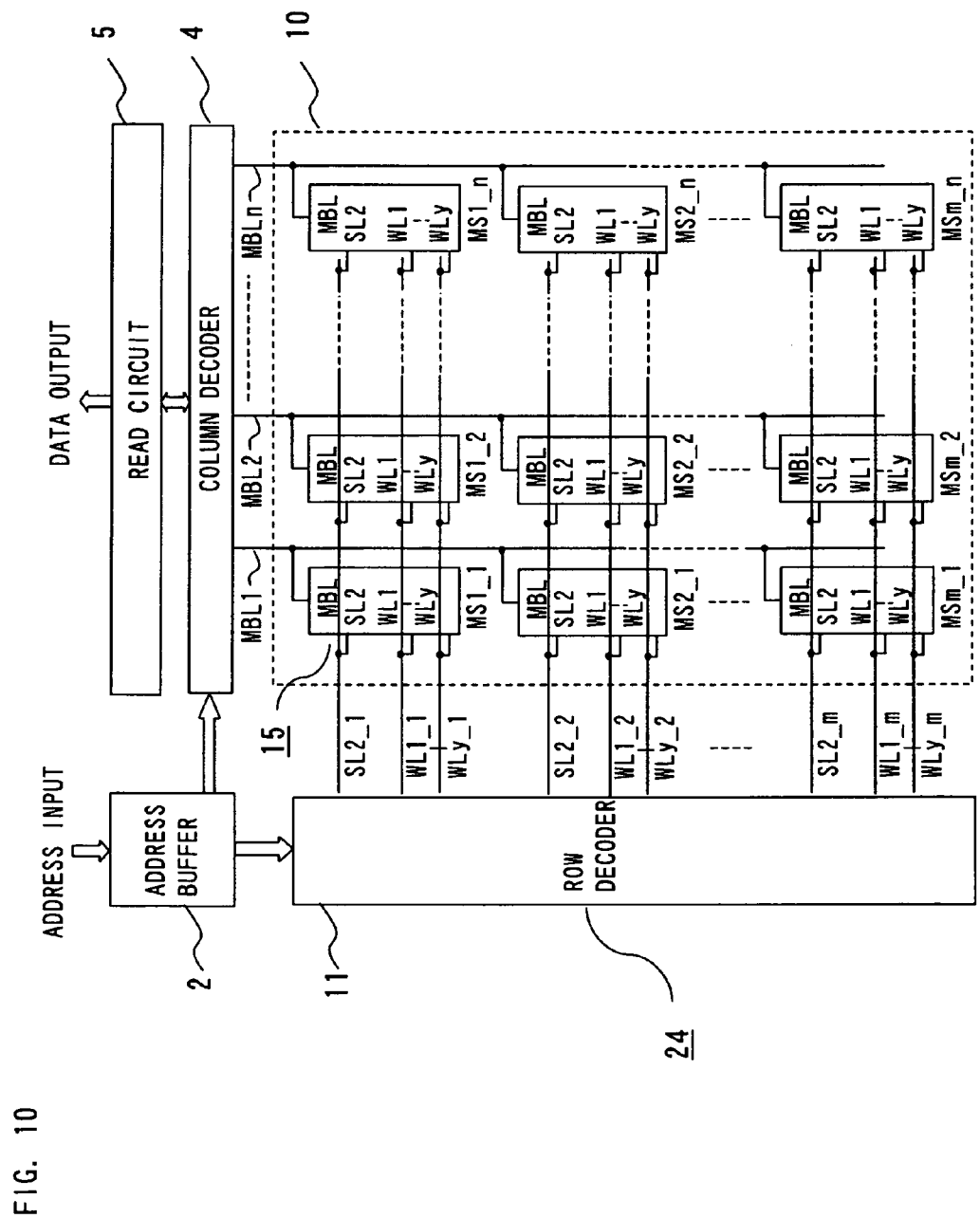
FIG. 10 is a block diagram illustrated a configuration of a semiconductor memory device according to a fourth embodiment of the present invention.

FIG. 10 is a block diagram illustrated a configuration of a semiconductor memory device according to a fourth embodiment of the present invention. The semiconductor memory device 24 comprises a memory cell array 10, an address buffer 2, a row decoder 11, a column decoder 4, and a read circuit 5. Note that the address buffer 2, the column decoder 4, and the read circuit 5 are configured in a manner similarly to that of the first embodiment, and will not be hereinafter described.

The memory cell array 10 includes (m×n) subarrays 15 (MS1_1 to MSm_n) arranged in a matrix, m block select lines SL2_1 to SL2_m, (y×m) word lines WL1_1 to WLy_m, and n main bit lines MBL1 to MBLn. The subarrays 15 (MSi_1 to MSi_n) provided on an i-th row are each connected to the block select line SL2_i and the word lines WL1_i to WLy_i. The subarrays 15 (MS1_j to MSm_j) provide on a j-th column are each connected to the main bit line MBLj.

Based on an address signal output from the address buffer 2, the row decoder 11 selects one block select line (e.g., SL2_i) from the block select lines SL2_1 to SL2_m, and one word line (e.g., WLk_i) from the word lines WL1_i to WLy_i.

Figure 11:
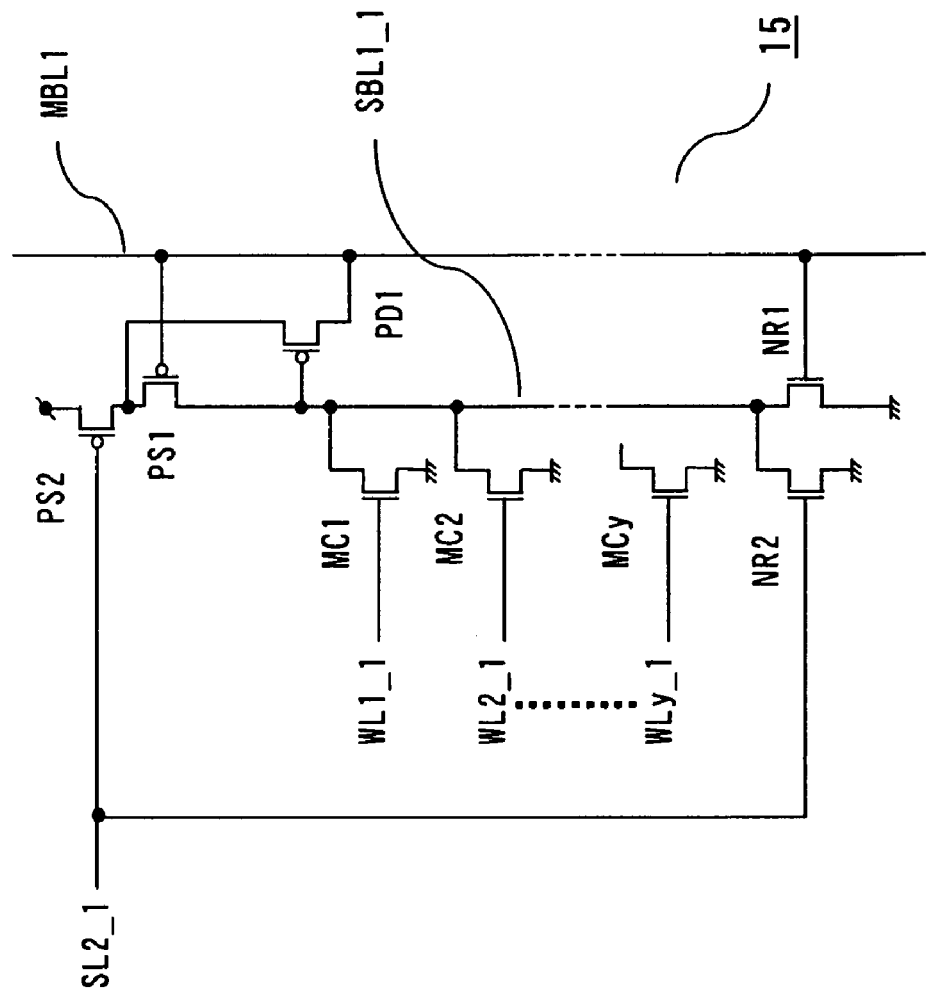
FIG. 11 is a circuit diagram illustrating a configuration of the subarray of FIG. 10.

FIG. 11 is a circuit diagram illustrating a configuration of the subarray 15 of FIG. 10. Note that all of the (m×n) subarrays 15 of FIG. 10 are similarly configured, and therefore, only the subarray MS1_1 of FIG. 10 will be described. The subarray 15 of the fourth embodiment includes a sub-bit line SBL1_1, y memory cells MC1 to MCy, a first MOS transistor PD1, a second MOS transistor PS1, and a third MOS transistor NR1. The subarray 15 of the fourth embodiment further includes a block select line SL2_1, a fourth MOS transistor PS2, and a fifth MOS transistor NR2. The block select line SL2_1, the fourth MOS transistor PS2, and the fifth MOS transistor NR2 correspond to a voltage control section for controlling a voltage supplied to the subarray 15.

Note that the memory cells MC1 to MCy, the first MOS transistor PD1, the second MOS transistor PS1, and the third MOS transistor NR1 are similar to those of the first embodiment, and will not be hereinafter described.

The fourth MOS transistor PS2, which is a P-channel MOS transistor, has a gate electrode connected to the second block select line SL2_1, a source electrode connected to a power source voltage, and a drain electrode connected to the source electrode of the first MOS transistor PD1 and the source electrode of the second MOS transistor PS1. The fifth MOS transistor NR2, which is an N-channel MOS transistor, whose conductivity type is different from a conductivity type of the fourth MOS transisitor PS2, has a gate electrode connected to the second block select line SL2_1, a source electrode connected to a ground voltage, and a drain electrode connected to the sub-bit line SBL1_1. Note that, as described above, the block select line SL2_1 and the word line WL1_1 to WLy_1 are each connected to the row decoder 11.

In the fourth embodiment, the current drive capability of each of the second MOS transistor PS1 and the fourth MOS transistor PS2, which are connected in series with each other, is larger than a total amount of off leakage currents of the memory cells MC1 to MCy connected to the sub-bit line SBL1_1 and is smaller than the current drive capability of one memory cell (e.g., MCk).

Figure 12:
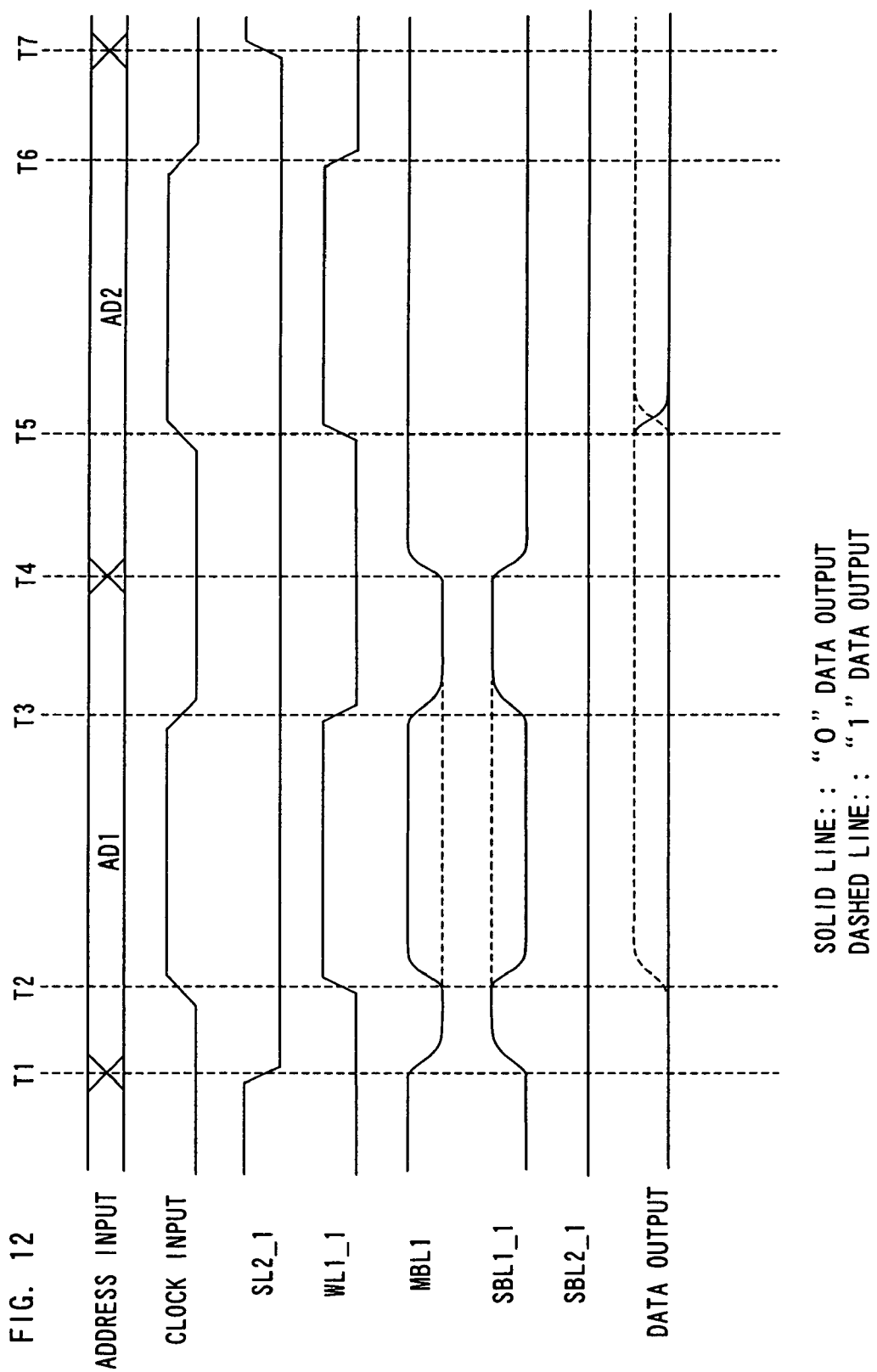
FIG. 12 is a timing diagram of the semiconductor memory device of the fourth embodiment of the present invention.
Figure 13:
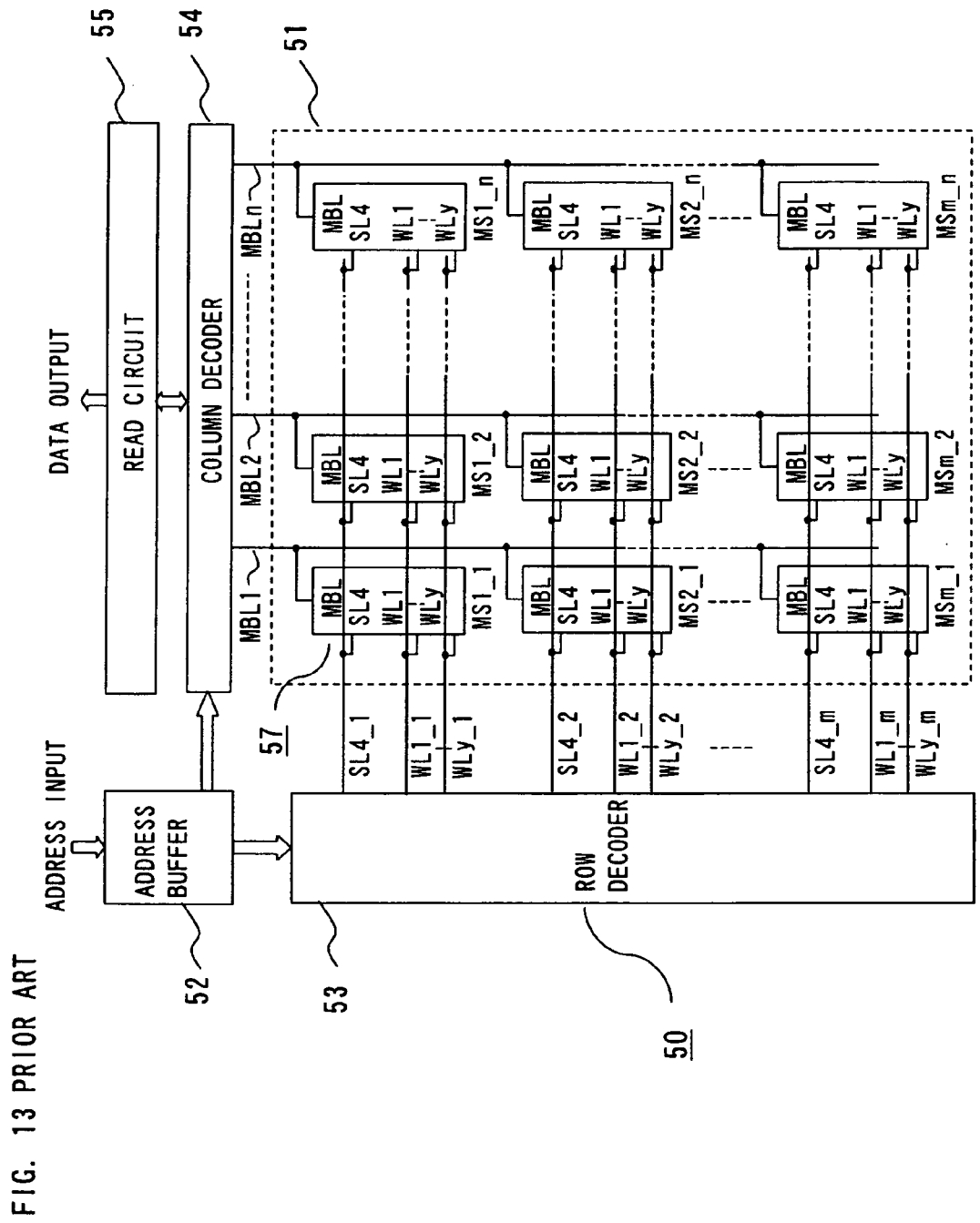
FIG. 13 is a block diagram illustrating a configuration of a conventional semiconductor memory device.

FIG. 12 is a timing diagram of the semiconductor memory device of the fourth embodiment of the present invention. Note that, in FIG. 12, an address AD1 is, for example, an address which specifies the memory cell MC1 in the subarray MS1_1 of FIG. 10, and an address AD2 is, for example, an address which specifies the memory cell MC1 in another subarray (MS1_2 to MS1_m) on a column different from that of MS1_1. A time period for which a clock of FIG. 12 is at the L level is a time period for which a precharge operation is performed. A time period for which the clock is at the H level is a time period for which a read operation is performed.

(1) Time period before time T1

Referring to FIG. 12 in combination with FIG. 11, the main bit line MBL1 is held at the H level before start of a read operation. In this case, the second MOS transistor PS1 is in the OFF state and the third MOS transistor NR1 is in the ON state, and therefore, the voltage of the sub-bit line SBL1_1 is held at the L level. Also for this time period, since the word line WL1_1 is in the non-selected state, the voltage of the word line WL1_1 is at the L level. Since the voltage of the block select line SL2_1 is held at the H level, the fourth MOS transistor PS2 is in the OFF state and the fifth MOS transistor NR2 is in the ON state.

(2) Time period from time T1 to time T2

Initially, when the address AD1 is inputted at time T1, the column decoder 4 selects the main bit line MBL1. Thereby, the main bit line MBL1 is caused to be in conduction with the read circuit 5 via the column decoder 4.

Next, based on the input address AD1, the row decoder 11 causes the voltage of the block select line SL2_1 to go to the L level. When the voltage of the block select line SL2_1 goes to the L level, the fourth MOS transistor PS2 goes to the ON state and the fifth MOS transistor NR2 goes to the OFF state.

Next, the read circuit 5 discharges the main bit line MBL1. Since the voltage of the sub-bit line SBL1_1 is at the L level in the initial state, the first MOS transistor PD1 is in the ON state. In this case, the fourth MOS transistor PS2 is also in the ON state, and therefore, a through current flows from the power source voltage to the main bit line MBL1 via the first MOS transistor PD1 and the fourth MOS transistor PS2. However, since the current drive capability of the read circuit 5 is larger than the through current, the voltage of the main bit line MBL1 goes to the L level. When the voltage of the main bit line MBL1 goes to the L level, the second MOS transistor PS1 goes to the ON state and the third MOS transistor NR1 goes to the OFF state.

In this case, both the second MOS transistor PS1 and the fourth MOS transistor PS2 go to the ON state, so that the sub-bit line SBL1_1 is charged via the second MOS transistor PS1 and the fourth MOS transistor PS2 by the power source voltage, and the voltage of the sub-bit line SBL1_1 goes to the H level. When the voltage of the sub-bit line SBL1_1 goes to the H level, the first MOS transistor PD1 goes to the OFF state, so that a through current does not flow from the power source voltage to the main bit line MBL1.

Note that the voltages of the other block select lines (SL2_2 to SL2_m in FIG. 10) are held at the H level, and therefore, the fourth MOS transistor PS2 is in the OFF state and the fifth MOS transistor NR2 is in the ON state in the other subarrays 15 (MS2_1 to MSm_1 in FIG. 10) connected to the main bit line MBL1. Therefore, the voltages of the sub-bit lines SBL2_1 to SBLm_1 included in the other subarrays MS2_1 to MSm_1 connected to the main bit line MBL1 are held at the L level. For example, as illustrated in FIG. 12, for this time period, the voltage of the sub-bit line SBL2_1 included in the subarray MS2_1 is held at the L level.

(3) Time period from time T2 to time T3

When the clock goes to the H level, the row decoder 11 selects the word line WL1_1 based on the input address AD1 and causes the voltage of the word line WL1_1 to go to the H level. When the voltage of the word line WL1_1 goes to the H level, the memory cell MC1 goes to the ON state. In this case, charge accumulated on the sub-bit line SBL1_1 is discharged via the memory cell MC1, so that the voltage of the sub-bit line SBL1_1 goes to the L level. When the sub-bit line SBL1_1 goes to the L level, the first MOS transistor PD1 goes to the ON state. Since the voltage of the block select line SL2_1 is at the L level, the fourth MOS transistor PS2 is in the ON state.

Thus, when both the first MOS transistor PD1 and the fourth MOS transistor PS2 go to the ON state, the main bit line MBL1 is caused to be in conduction with the power source voltage via the first MOS transistor PD1 and the fourth MOS transistor PS2. Therefore, the voltage of the main bit line MBL1 goes to the H level by means of the power source voltage applied by the voltage control section. When the voltage level of the main bit line MBL1 is at the H level, the read circuit 5 outputs L-level data to the outside as illustrated with a solid line in FIG. 12. Note that, when the main bit line MBL1 is at the H level, the third MOS transistor NR1 is in the ON state and the second MOS transistor PS1 is in the OFF state. Therefore, charge accumulated in the sub-bit line SBL1_1 is discharged through the source electrode of the third MOS transistor NR1, so that the voltage of the sub-bit line SBL1_1 is held at the L level.

On the other hand, it is assumed that the drain electrode of the memory cell MC1 is not connected to the sub-bit line SBL1_1. In this case, even when the row decoder 11 selects the word line WL1_1 and causes the voltage of the word line WL1_1 to go to the H level, charge accumulated on the sub-bit line SBL1_1 is not discharged via the memory cell MC1, and therefore, the voltage of the sub-bit line SBL1_1 is held at the H level. Therefore, the first MOS transistor PD1 is held at the OFF state.

Thus, even when the fourth MOS transistor PS2 is in the ON state, since the first MOS transistor PD1 is in the OFF state, the main bit line MBL1 is not caused to be in conduction with the power source voltage. Therefore, the voltage of the main bit line MBL1 is held at the L level. When the level of the main bit line MBL1 is at the L level, the read circuit 5 outputs H-level data to the outside as illustrated with a dashed line in FIG. 12.

(4) Time period from time T3 to time T4

After data is read out, both the main bit line MBL1 and the word line WL1_1 go to the non-selected state, i.e., go to the L level in order to be ready for the next read operation.

(5) Time period from time T4 to time T7

Thereafter, stored data is read out with respect to the address AD2 input at time T4 in a manner similar to that for the time period from time T1 to time T4. Note that, in FIG. 12, the address AD2 is an address which specifies the memory cell MC1 in a subarray MS1_i on a column different from that of the subarray MS1_1, and therefore, for a data read time period from time T5 to time T6, whereas the voltage of the block select line SL2_1 is at the L level and the voltage of the word line WL1_1 goes to the H level, the main bit line MBL1 goes to the H level and the sub-bit lines SBL1_1 and SBL2_1 go to the L level.

According to the above-described semiconductor memory device 24, charging of the sub-bit line SBL1_1 and discharging of the main bit line MBL1 are performed using the power source voltage, and therefore, a transistor for causing the main bit line MBL1 and the sub-bit line SBL1_1 to be in conduction with each other is no longer required. Therefore, even with a low power source voltage, there is substantially no influence of the substrate bias effect, thereby making it possible to achieve a high-speed data read operation.

In the semiconductor memory device 24 of the second embodiment, the block select line, the fourth MOS transistor PS2, and the fifth MOS transistor NR2 are additionally required as compared to the first embodiment, but the voltage of the sub-bit line in a subarray(s) in the non-selected state among a plurality of subarrays connected to a single main bit line can be held at the L level, thereby making it possible to reduce power consumption.

In the semiconductor memory device 24 of the fourth embodiment, one voltage control section including the block select line, the fourth MOS transistor PS2, and the fifth MOS transistor NR2 are provided for each subarray 15. Alternatively, the subarrays 15 are divided into groups, and one voltage control section may be provided for each group. For example, in FIG. 10, if a plurality of subarrays (MSi_1 to MSi_n) provided on the same row share one voltage control section, the number of transistors constituting the memory array 10 can be reduced, thereby making it possible to further reduce the area of the semiconductor memory device 24.

In the fourth embodiment, the presence and absence of connection between the drain electrodes of the memory cells MC1 to MCy and the sub-bit line are associated with data "0" and data "1", respectively. Alternatively, the magnitudes of the threshold voltages of the MOS transistors included in the memory cells MC1 to MCy may be associated with data "0" and data "1", and all of the drain electrodes of the memory cells MC1 to MCy may be connected to the sub-bit line. More specifically, the threshold voltage of a MOS transistor corresponding to one of the data values has a magnitude which allows the MOS transistor to certainly switch between the ON state and the OFF state using a voltage applied to the word line, and the threshold voltage of a MOS transistor corresponding to the other data value has a magnitude which does not allow the MOS transistor to go to the ON state by means of a voltage applied to the word line. In a mask ROM having such a memory cell, an effect similar to that of the semiconductor memory device of the fourth embodiment is achieved.

The semiconductor memory device of the present invention comprises a transistor having a gate electrode connected to a sub-bit line and a drain electrode connected to a main bit line and does not need a transistor for causing the main bit line and the sub-bit line to be in conduction with each other, thereby making it possible to achieve a high-speed data read operation with a low voltage. Therefore, the semiconductor memory device of the present invention is useful as a circuit technique for achieving a high-speed data read operation with a low voltage.

While the invention has been described in detail, the foregoing description is in all aspects illustrative and not restrictive. It is understood that numerous other modifications and variations can be devised without departing from the scope of the invention.

What is claimed is:

1. A semiconductor memory device with a hierarchical bit line structure, comprising:
   a plurality of subarrays arranged in a row direction and a column direction;
   a plurality of word lines connected to the subarrays provided in the row direction;
   a plurality of main bit lines connected to the subarrays provided in the column direction; and
   a voltage control section for controlling a voltage supplied to the subarray, wherein
   the subarray includes:
      a sub-bit line;
      a plurality of memory cells which are connected to the word lines and change a voltage of the sub-bit line to a voltage corresponding to data stored therein, in response to selection of the word lines;
      a first MOS transistor having a gate electrode connected to the sub-bit line and a drain electrode connected to the main bit line;
      a second MOS transistor having a gate electrode connected to the main bit line and a drain electrode connected to the sub-bit line;
      a third MOS transistor, whose conductivity type is different from a conductivity type of the second MOS transistor, having a gate electrode connected to the main bit line, a source electrode connected to a ground voltage, and a drain electrode connected to the sub-bit line, and
   the voltage control section is capable of applying a power source voltage to the source electrode of the first MOS transistor and the source electrode of the second MOS transistor.

2. The semiconductor memory device according to claim 1, wherein
   the voltage control section includes:
      a block select line; and
      a fourth MOS transistor having a gate electrode connected to the block select line, a source electrode connected to the power source voltage, and a drain electrode connected to the source electrode of the first MOS transistor, and
   the power source voltage is applied to the source electrode of the second MOS transistor.

3. The semiconductor memory device according to claim 2, wherein a current drive capability of the second MOS transistor is larger than a total amount of off leakage currents of MOS transistors included in the memory cells connected to the sub-bit line and is smaller than a current drive capability of each of the MOS transistors included in the memory cells.

4. The semiconductor memory device according to claim 1, wherein
   the voltage control section includes:
      a first block select line;
      a second block select line;
      a fourth MOS transistor having a gate electrode connected to the first block select line, a source electrode connected to the power source voltage, and a drain electrode connected to the source electrode of the first MOS transistor;

a fifth MOS transistor having a gate electrode connected to the second block select line, a source electrode connected to the power source voltage, and a drain electrode connected to the source electrode of the second MOS transistor; and a sixth MOS transistor, whose conductivity type is different from a conductivity type of the fifth MOS transistor, having a gate electrode connected to the second block select line, a source electrode connected to the ground voltage, and a drain electrode connected to the sub-bit line.

5. The semiconductor memory device according to claim 4, wherein a current drive capability of each of the second MOS transistor and the fifth MOS transistor, which are connected in series with each other, is larger than a total amount of off leakage currents of MOS transistors included in the memory cells connected to the sub-bit line and is smaller than a current drive capability of each of the MOS transistors included in the memory cells.

6. The semiconductor memory device according to claim 1, wherein the voltage control section includes:

a first block select line;

a second block select line;

a third block select line;

a fourth MOS transistor having a gate electrode connected to the first block select line, a source electrode connected to the power source voltage, and a drain electrode connected to the source electrode of the first MOS transistor;

a fifth MOS transistor having a gate electrode connected to the second block select line, a source electrode connected to the power source voltage, and a drain electrode connected to the source electrode of the second MOS transistor;

a sixth MOS transistor, whose conductivity type is different from a conductivity type of the fifth MOS transistor, having a gate electrode connected to the second block select line, a source electrode connected to the ground voltage, and a drain electrode connected to the sub-bit line; and a seventh MOS transistor having a gate electrode connected to the third block select line, a source electrode connected to the power source voltage, and a drain electrode connected to the source electrode of the second MOS transistor.

7. The semiconductor memory device according to claim 6, wherein a current drive capability of each of the second MOS transistor and the fifth MOS transistor, which are connected in series with each other, is larger than a total amount of off leakage currents of MOS transistors included in the memory cells connected to the sub-bit line and is smaller than a current drive capability of each of the MOS transistors included in the memory cells.

8. The semiconductor memory device according to claim 1, wherein the voltage control section includes:

a block select line;

a fourth MOS transistor having a gate electrode connected to the block select line, a source electrode connected to the power source voltage, and a drain electrode connected to the source electrode of the first MOS transistor and the source electrode of the second MOS transistor; and a fifth MOS transistor, whose conductivity type is different from a conductivity type of the fourth MOS transistor, having a gate electrode connected to the block select line, a source electrode connected to the ground voltage, and a drain electrode connected to the sub-bit line.

9. The semiconductor memory device according to claim 8, wherein a current drive capability of each of the second MOS transistor and the fourth MOS transistor, which are connected in series with each other, is larger than a total amount of off leakage currents of MOS transistors included in the memory cells connected to the sub-bit line and is smaller than a current drive capability of each of the MOS transistors included in the memory cells.

10. The semiconductor memory device according to claim 1, wherein the memory cell includes a MOS transistor having a gate electrode connected to the word line, a source electrode connected to the ground voltage, and a drain electrode which is, or is not, connected to the sub-bit line, depending on data stored therein.

11. The semiconductor memory device according to claim 1, wherein the memory cell includes a MOS transistor having a gate electrode connected to the word line, a source electrode connected to the ground voltage, and a drain electrode connected to the sub-bit line, and having a threshold voltage having a magnitude corresponding to data stored therein.

12. The semiconductor memory device according to claim 1, wherein the voltage control section is provided for each of the plurality of subarrays.

13. The semiconductor memory device according to claim 1, wherein the plurality of subarrays are divided into groups, and the voltage control section is provided for each group.

* * * * *